(12) United States Patent
Kawada et al.

(10) Patent No.: US 10,991,849 B2
(45) Date of Patent: Apr. 27, 2021

(54) LIGHT-EMITTING THYRISTOR, LIGHT-EMITTING ELEMENT CHIP, OPTICAL PRINT HEAD, AND IMAGE FORMING APPARATUS

(71) Applicant: Oki Data Corporation, Tokyo (JP)

(72) Inventors: Hiroto Kawada, Tokyo (JP); Kenichi Tanigawa, Tokyo (JP); Shinya Jyumonji, Tokyo (JP); Takuma Ishikawa, Tokyo (JP); Chihiro Takahashi, Tokyo (JP)

(73) Assignee: OKI DATA CORPORATION, Tokyo (JP)

( * ) Notice: Subject to any disclaimer, the term of this patent is extended or adjusted under 35 U.S.C. 154(b) by 0 days.

(21) Appl. No.: 16/601,827

(22) Filed: Oct. 15, 2019

(65) Prior Publication Data

US 2020/0212260 A1 Jul. 2, 2020

(30) Foreign Application Priority Data

Dec. 27, 2018 (JP) .............................. JP2018-244999

(51) Int. Cl.
*H01L 33/30* (2010.01)
*H01L 33/00* (2010.01)
*H01L 33/38* (2010.01)
*H01L 29/66* (2006.01)

(52) U.S. Cl.
CPC ...... *H01L 33/305* (2013.01); *H01L 29/66401* (2013.01); *H01L 33/0016* (2013.01); *H01L 33/0041* (2013.01); *H01L 33/38* (2013.01)

(58) Field of Classification Search
None
See application file for complete search history.

(56) References Cited

U.S. PATENT DOCUMENTS

2019/0070864 A1* 3/2019 Uchida ............ G03G 15/04036

FOREIGN PATENT DOCUMENTS

| EP | 2272677 A2 | 1/2011 |
|---|---|---|
| JP | 2005340471 A | * 12/2005 |
| JP | 2005340471 A | 12/2005 |
| JP | 2007180460 A | 7/2007 |
| JP | 2010239084 A | 10/2010 |
| JP | 2015109417 A | 6/2015 |

* cited by examiner

*Primary Examiner* — Nicholas J Tobergte
*Assistant Examiner* — Kien C Ly
(74) *Attorney, Agent, or Firm* — Panitch Schwarze Belisario & Nadel LLP

(57) ABSTRACT

A light-emitting thyristor includes a first semiconductor layer of a first conductivity type; a second semiconductor layer of a second conductivity type arranged adjacent to the first semiconductor layer; a third semiconductor layer of the first conductivity type arranged adjacent to the second semiconductor layer; and a fourth semiconductor layer of the second conductivity type arranged adjacent to the third semiconductor layer. The first semiconductor layer includes an active layer adjacent to the second semiconductor layer, the second semiconductor layer includes a first layer adjacent to the active layer and a second layer arranged between the first layer and the third semiconductor layer, and the first layer has a band gap wider than a band gap of the active layer and a band gap of the second layer.

16 Claims, 14 Drawing Sheets

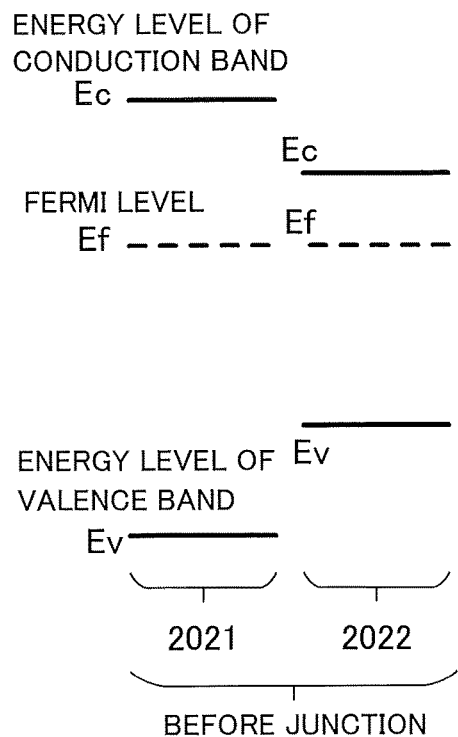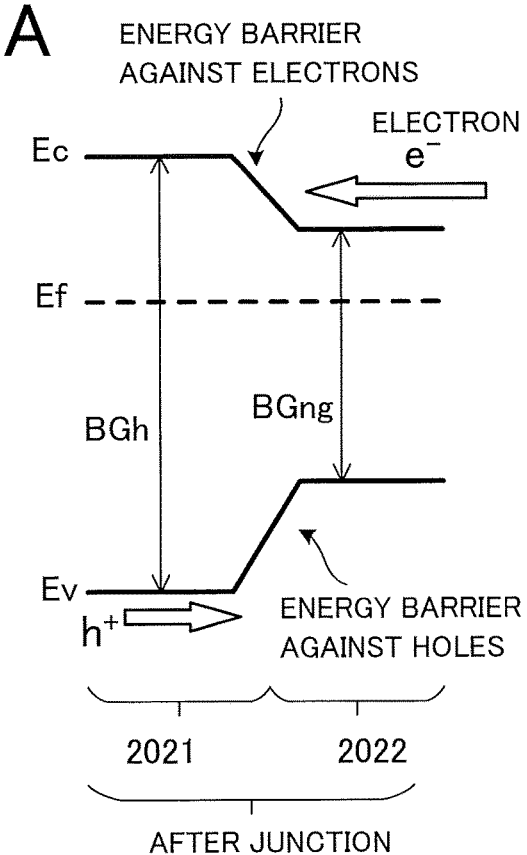
FIG. 15A
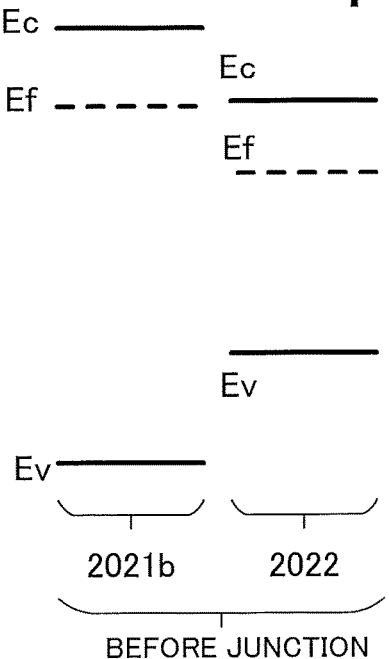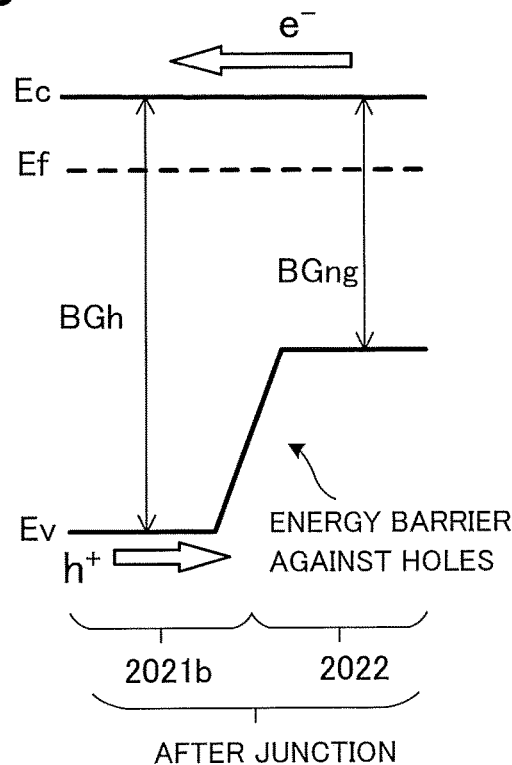
FIG. 15B

LIGHT-EMITTING THYRISTOR, LIGHT-EMITTING ELEMENT CHIP, OPTICAL PRINT HEAD, AND IMAGE FORMING APPARATUS

CROSS-REFERENCE TO RELATED APPLICATION

This application claims priority under 35 U.S.C. § 119(b) to Japanese Application No. 2018-244999, filed Dec. 27, 2018, the disclosure of which is incorporated by reference herein in its entirety.

TECHNICAL FIELD

The present invention relates to a light-emitting thyristor, a light-emitting element chip including the light-emitting thyristor, an optical print head including the light-emitting element chip, and an image forming apparatus including the optical print head.

BACKGROUND ART

Conventionally, image forming apparatuses of the electrophotographic type which are equipped with an optical print head including a plurality of light-emitting elements as an exposure device, are widespread. In such an image forming apparatus, an electrostatic latent image is formed on a surface of a photosensitive drum by applying light emitted from the optical print head to the surface of the photosensitive drum. As the light-emitting elements included in the optical print head, light-emitting thyristors as three-terminal light-emitting elements are well known. See Japanese Patent Application Publication No. 2010-239084, for example.

However, light-emitting thyristors are required to have a more excellent light emission property than that of the conventional light-emitting thyristors.

SUMMARY OF THE INVENTION

An object of the present invention is to provide a light-emitting thyristor having an excellent light emission property, a light-emitting element chip including the light-emitting thyristor, an optical print head including the light-emitting element chip, and an image forming apparatus including the optical print head.

A light-emitting thyristor according to an aspect of the present invention includes: a first semiconductor layer of a first conductivity type; a second semiconductor layer of a second conductivity type arranged adjacent to the first semiconductor layer; a third semiconductor layer of the first conductivity type arranged adjacent to the second semiconductor layer; and a fourth semiconductor layer of the second conductivity type arranged adjacent to the third semiconductor layer, wherein the first semiconductor layer includes an active layer adjacent to the second semiconductor layer, the second semiconductor layer includes a first layer adjacent to the active layer and a second layer arranged between the first layer and the third semiconductor layer, and the first layer has a band gap wider than the band gap of the active layer and the band gap of the second layer.

According to the present invention, a light-emitting thyristor and a light-emitting element chip having an excellent light emission property can be provided. Further, according to the present invention, an optical print head and an image forming apparatus capable of improving the quality of print images can be provided.

BRIEF DESCRIPTION OF THE DRAWINGS

In the attached drawings:

FIGS. 15A and 15B are diagrams showing effects of the light-emitting thyristor according to the third embodiment;

DETAILED DESCRIPTION OF THE INVENTION

Figure 1:
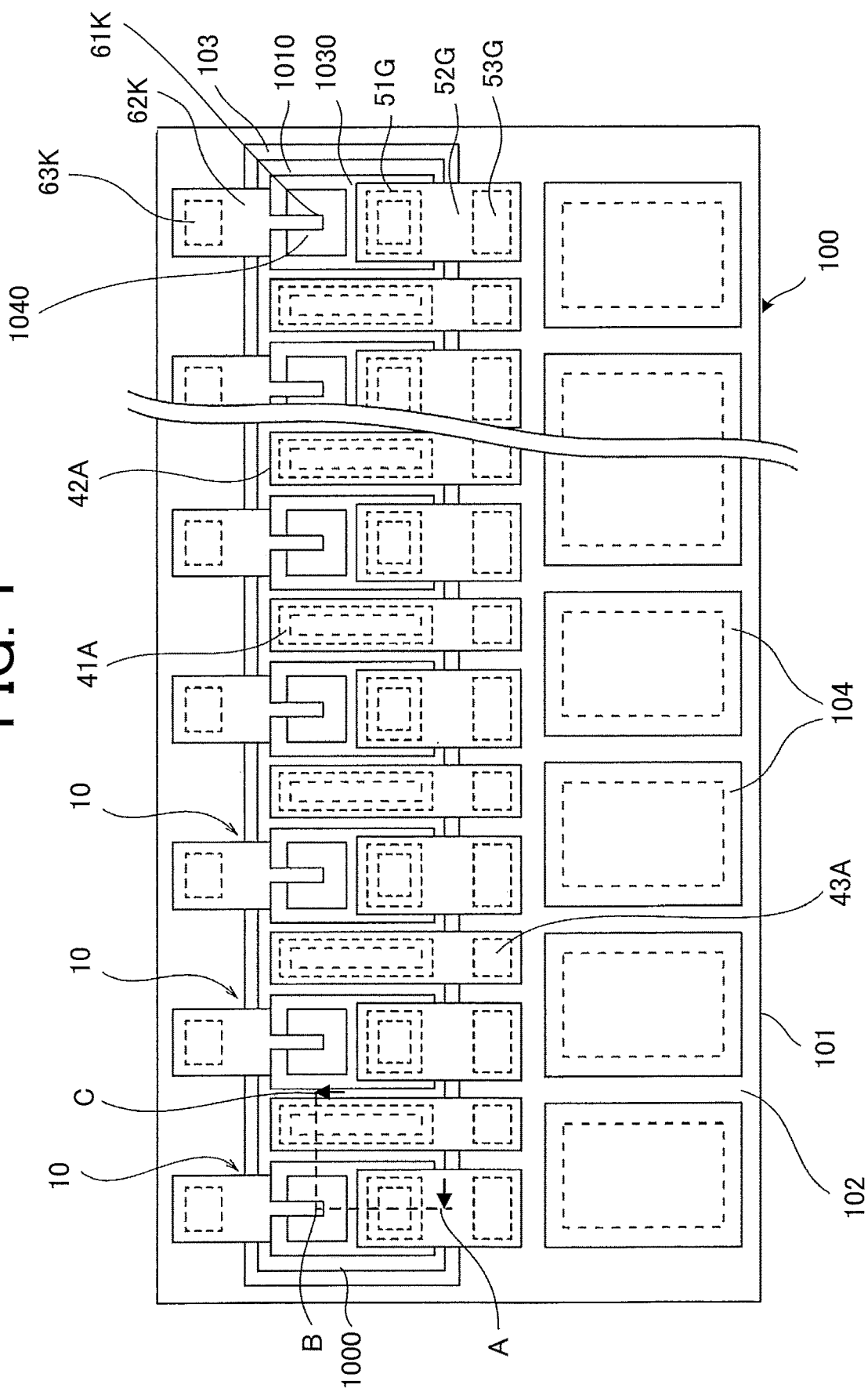
FIG. 1 is a schematic plan view showing the structure of a light-emitting thyristor according to a first embodiment of the present invention.

Light-emitting thyristors, light-emitting element chips, optical print heads and image forming apparatuses according to embodiments of the present invention will be described below with reference to drawings. In the drawings, the same components are assigned the same reference characters. The following embodiments are just examples and a variety of modifications are possible within the scope of the present invention. For example, configurations of embodiments can be properly combined with each other.

In a first embodiment (FIG. 1 to FIG. 7), a second embodiment (FIG. 8 to FIG. 13), a third embodiment (FIG. 14 to FIG. 17) and a fourth embodiment (FIG. 18 to FIG. 21), the light-emitting thyristors and the light-emitting element chips will be described. The light-emitting element chip includes one or more light-emitting thyristors. The light-emitting element chip may include a plurality of light-emitting thyristors arranged linearly. For example, the light-emitting element chip includes a substrate part and a plurality of light-emitting thyristors arranged on the substrate part. The light-emitting element chip may include a semiconductor integrated circuit part (also referred to as a "drive IC") as a drive circuit for lighting up and extinguishing the plurality of light-emitting thyristors. The light-emitting element chip including the light-emitting thyristors and the drive IC is also referred to as a "semiconductor composite device".

In a fifth embodiment (FIG. 22 and FIG. 23), an optical print head including the light-emitting element chip in any one of the first to fourth embodiments will be described. The optical print head includes one or more light-emitting element chips. The optical print head is an exposure device for forming an electrostatic latent image on a surface of a photosensitive drum used as an image carrier of an image forming apparatus. The optical print head may include a plurality of light-emitting element chips arranged linearly.

In a sixth embodiment (FIG. 24), an image forming apparatus including the optical print head according to the fifth embodiment will be described. The image forming apparatus is a device that forms an image made of a developing agent on a print medium by means of an electrophotographic process. The image forming apparatus is a printer, a copy machine, a facsimile machine, a multi-function peripheral (MFP) or the like, for example.

(1) First Embodiment (1-1) Configuration

FIG. 1 is a schematic plan view showing the structure of a light-emitting thyristor 10 according to the first embodiment. FIG. 1 shows a semiconductor device 1000 including a plurality of light-emitting thyristors 10. The semiconductor device 1000 is arranged on a substrate part 101. As shown in FIG. 1, the substrate part 101 includes a substrate 102 and a planarization layer 103 formed on the substrate 102, for example. A light-emitting element chip 100 includes the substrate part 101 and the semiconductor device 1000 formed on the substrate part 101. The semiconductor device 1000 is also referred to as a "light-emitting element array" or a "light-emitting thyristor array". Further, the light-emitting element chip 100 is also referred to as a "light-emitting element array chip" or a "light-emitting thyristor array chip". Incidentally, an insulation film 71 (shown in FIG. 2) is not shown in FIG. 1 for easy understanding of the structure of the semiconductor device 1000.

For example, a Si (silicon) substrate, an IC (integrated circuit) substrate, a glass substrate, a ceramic substrate, a plastic substrate, a metal plate or the like is usable as the substrate 102. In the first embodiment, the substrate 102 is an IC substrate including a drive IC for driving the light-emitting thyristors as three-terminal light-emitting elements and an external connection pad 104 used for the wiring to an external device.

The planarization layer 103 has a smooth surface on which the light-emitting thyristors 10 are arranged. The planarization layer 103 is an inorganic film or an organic film. In a case where a top surface of the substrate 102 is smooth, it is also possible to provide the semiconductor device 1000 on the top surface of the substrate 102 without providing the planarization layer 103.

The light-emitting thyristor 10 is formed on a growth substrate used as a manufacturing substrate, for example. In a case where the light-emitting thyristor 10 is formed of AlGaAs (aluminum gallium arsenide)-based semiconductor material, a GaAs (gallium arsenide) substrate can be used as the growth substrate. The light-emitting thyristor 10 is formed on the growth substrate by means of epitaxial growth, for example. The light-emitting thyristor 10 is formed by, for example, peeling off an epitaxial film, as a semiconductor thin film having multilayer structure of semiconductor layers, from the growth substrate, sticking the peeled epitaxial film on a surface of the planarization layer 103 on the substrate 102, and processing the epitaxial film. The epitaxial film placed on the surface of the planarization layer 103 is fixed to the planarization layer 103 by intermolecular force or the like.

Figure 2:
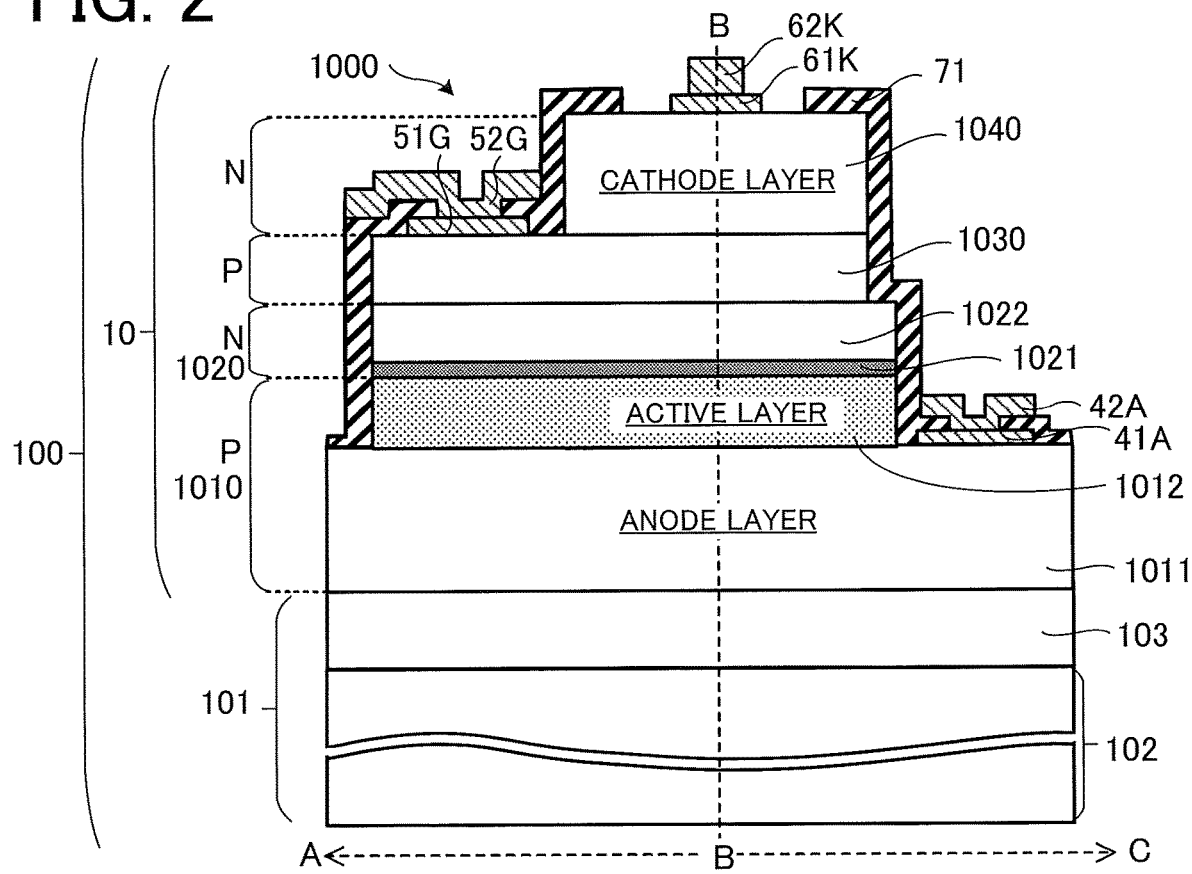
FIG. 2 is a schematic cross-sectional view showing the structure of the light-emitting thyristor according to the first embodiment, namely, the structure of a cross-section taken along a line A-B-C in FIG. 1.

FIG. 2 is a schematic cross-sectional view showing the structure of the light-emitting thyristor 10 according to the first embodiment, namely, the structure of a cross-section taken along a line A-B-C in FIG. 1. As shown in FIG. 2, the light-emitting thyristor 10 includes a first semiconductor layer 1010 of a first conductivity type, a second semiconductor layer 1020 of a second conductivity type different from the first conductivity type arranged adjacent to the first semiconductor layer 1010, a third semiconductor layer 1030 of the first conductivity type arranged adjacent to the second semiconductor layer 1020, and a fourth semiconductor layer 1040 of the second conductivity type arranged adjacent to the third semiconductor layer 1030. In the first embodiment, the first conductivity type is the P type and the second conductivity type is the N type.

Further, as shown in FIG. 2, the light-emitting thyristor 10 includes an anode electrode 41A as a first electrode electrically connected to the first semiconductor layer 1010, a gate electrode 51G as a second electrode electrically connected to the third semiconductor layer 1030, and a cathode electrode 61K as a third electrode electrically connected to the fourth semiconductor layer 1040. The cathode electrode 61K is electrically connected to a cathode terminal 63K (shown in FIG. 1) of the substrate part 101 by cathode wiring 62K. The gate electrode 51G is electrically connected to a gate terminal 53G (shown in FIG. 1) of the substrate part 101 by gate wiring 52G. The anode electrode 41A is connected to an anode terminal 43A (shown in FIG. 1) of the substrate part 101 by anode wiring 42A.

The P-type first semiconductor layer 1010 includes an anode layer 1011 electrically connected to the anode electrode 41A and a P-type active layer 1012 arranged adjacent to the anode layer 1011.

The N-type second semiconductor layer 1020 includes an N-type hole barrier layer 1021 as a barrier layer arranged adjacent to the active layer 1012 and an N-type gate layer 1022 arranged between the hole barrier layer 1021 and the third semiconductor layer 1030. The hole barrier layer 1021 is also referred to as a "first layer". The N-type gate layer 1022 is also referred to as a "second layer".

Figure 3:
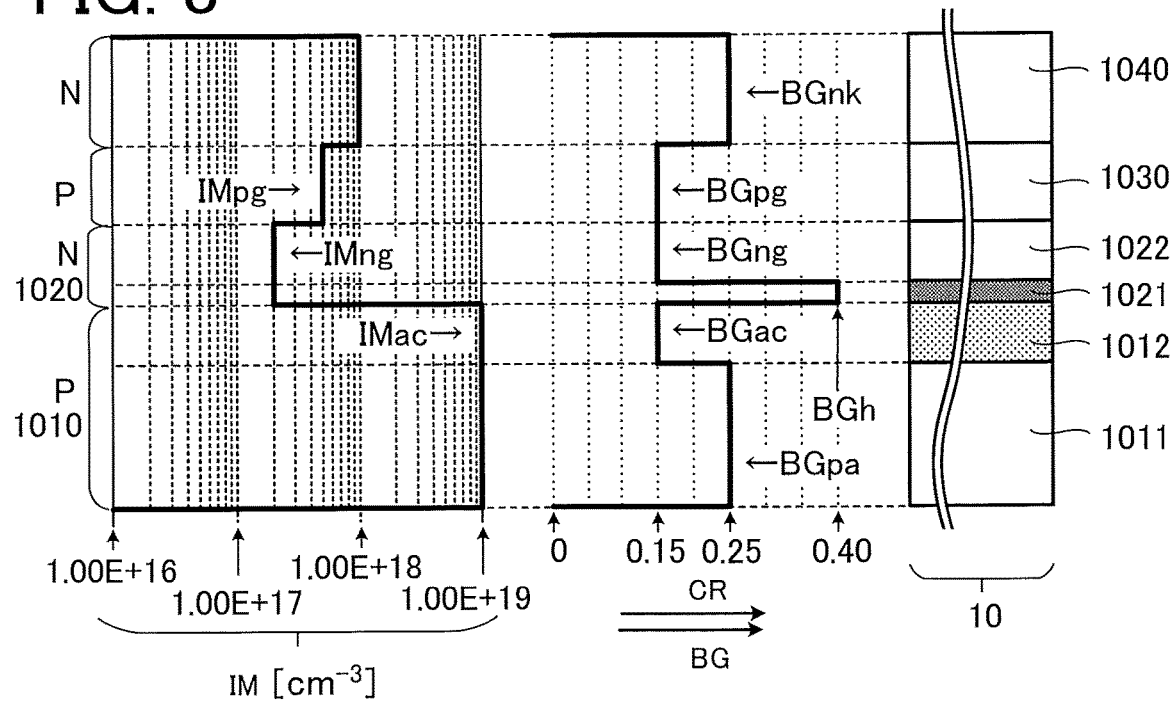
FIG. 3 is a diagram showing an example of an impurity concentration and an Al composition ratio of each semiconductor layer in the light-emitting thyristor in FIG. 2.

FIG. 3 is a diagram showing an example of an impurity concentration IM (cm$^{-3}$) and an Al (aluminum) composition ratio CR of each semiconductor layer in the light-emitting thyristor 10. In the first embodiment, let IMpg represent the impurity concentration of the third semiconductor layer (P-type gate layer) 1030, IMng represent the impurity concentration of the second semiconductor layer (N-type gate layer) 1020, and IMac represent the impurity concentration of the active layer 1012 of the first semiconductor layer 1010, the light-emitting thyristor 10 is formed to satisfy the following conditional expressions (1) and (2):

$$IMpg < IMac \tag{1}$$

$$IMng < IMac \tag{2}$$

In FIG. 3, the following numerical examples are shown as the impurity concentrations:

$$IMac \approx 1 \times 10^{19} \text{ cm}^{-3}$$

$$IMpg \approx 5 \times 10^{17} \text{ cm}^{-3}$$

$$IMng \approx 2 \times 10^{17} \text{ cm}^{-3}$$

However, the impurity concentrations are not limited to the numerical examples shown in FIG. 3.

In the light-emitting thyristor 10, the reason for setting the impurity concentration IMpg of the third semiconductor layer (P-type gate layer) 1030 and the impurity concentration IMng of the second semiconductor layer (N-type gate layer) 1020 at low values and setting the impurity concentration IMac of the active layer 1012 of the first semiconductor layer 1010 at a high value is to increase the luminous efficiency by lowering the occurrence probability of recombination of an electron and a hole in the second semiconductor layer 1020 and the third semiconductor layer 1030 and raising the occurrence probability of the recombination of an electron and a hole in the active layer 1012 where the impurity concentration IMac is high.

Further, in the first embodiment, let CRpg represent the Al composition ratio of the third semiconductor layer (P-type gate layer) 1030, CRng represent the Al composition ratio of the N-type gate layer 1022, CRac represent the Al composition ratio of the active layer 1012, and CRh represent the Al composition ratio of the hole barrier layer 1021, the light-emitting thyristor 10 is formed to satisfy the following conditional expression (3):

$$CRac = CRng = CRpg < CRh \tag{3}$$

However, CRac=CRng=CRpg in the conditional expression (3) does not necessarily have to be satisfied. The light-emitting thyristor 10 may also be formed to satisfy the following conditional expressions (4) and (5) instead of the conditional expression (3):

$$CRac \le CRpg < CRh \tag{4}$$

$$CRac \le CRng < CRh \tag{5}$$

The Al composition ratio CR of each semiconductor layer of the light-emitting thyristor 10 corresponds to the band gap BG of each semiconductor layer. Put another way, the band gap BG of each semiconductor layer of the light-emitting thyristor 10 increases with the increase in the Al composition ratio CR of the semiconductor layer, and the band gap BG of each semiconductor layer decreases with the decrease in the Al composition ratio CR of the semiconductor layer. Thus, the conditional expressions (3) to (5) are equivalent to the following conditional expressions (6) to (8) using the band gap:

$$BGac = BGng = BGpg < BGh \tag{6}$$

$$BGac \le BGpg < BGh \tag{7}$$

$$BGac \le BGng < BGh \tag{8}$$

Here, BGpg represents the band gap of the third semiconductor layer (P-type gate layer) 1030, BGng represents the band gap of the N-type gate layer 1022, BGac represents the band gap of the active layer 1012, and BGh represents the band gap of the hole barrier layer 1021.

In FIG. 3, the following numerical examples are shown as the Al composition ratios:

$$CRac = CRng = CRpg \approx 0.15$$

$$CRh \approx 0.40$$

Further, let the Al composition ratio of the anode layer 1011 be represented as CRpa (corresponding to a band gap BGpa) and the Al composition ratio of the fourth semiconductor layer 1040 be represented as CPRnk (corresponding to a band gap BGnk), FIG. 3 shows an example satisfying:

$$CRpa = CRrk \approx 0.25$$

However, the Al composition ratios are not limited to the numerical examples in FIG. 3.

The semiconductor materials forming the light-emitting thyristor 10 are, for example, InP (indium phosphorous)-based semiconductor materials, AlGaAs-based semiconductor materials, AlInGaP (aluminum indium gallium phosphorous)-based semiconductor materials, or the like.

In a case where the light-emitting thyristor 10 is formed with AlGaAs-based semiconductor materials, each semiconductor layer can be configured as below, for example. The anode layer 1011 of the first semiconductor layer 1010 is formed with a P-type $Al_{0.25}Ga_{0.75}As$ layer, the active layer 1012 is formed with a P-type $Al_{0.15}Ga_{0.85}As$ layer, the hole barrier layer 1021 is formed with an N-type $Al_{0.4}Ga_{0.6}As$ layer, and the N-type gate layer 1022 is formed with an N-type $Al_{0.15}Ga_{0.85}As$ layer. The third semiconductor layer (P-type gate layer) 1030 is formed with a P-type $Al_{0.15}Ga_{0.85}As$ layer, and the fourth semiconductor layer (cathode layer) 1040 is formed with an N-type $Al_{0.25}Ga_{0.75}As$ layer.

When AlGaAs is expressed as $Al_yGa_{1-y}As$ ($0 \le y \le 1$), y is the Al composition ratio. The Al composition ratio CRac of the active layer 1012 is desired to be higher than or equal to 0.14 and lower than or equal to 0.18. The Al composition ratio CRng of the N-type gate layer 1022 and the Al composition ratio CRpg of the third semiconductor layer (P-type gate layer) 1030 are desired to be higher than or equal to 0.14 and lower than or equal to 0.25. The Al composition ratio CRh of the hole barrier layer 1021 is desired to be higher than or equal to 0.2 and lower than or equal to 0.5.

The gate electrode 51G and the anode electrode 41A can be formed with metal capable of forming an ohmic contact with P-type AlGaAs, such as Ti (titanium), Pt (platinum), Au (gold), Ni (nickel) or Zn (zinc), alloy of these metals, multilayer structure of these metals or alloys, or the like. The cathode electrode 61K can be formed with metal capable of forming an ohmic contact with N-type AlGaAs, such as Au, Ge (germanium), Ni or Pt, alloy of these metals, multilayer structure of these metals or alloys, or the like.

The insulation film 71 can be formed with an inorganic insulation film such as a SiN film (silicon nitride film) or a $SiO_2$ film (silicon dioxide film), or an organic insulation film such as a polyimide film.

(1-2) Operation

In the semiconductor device 1000, each light-emitting thyristor 10 is brought into a lighted state (light emission state), i.e., an ON state, when the drive IC (e.g., a semiconductor integrated circuit formed in the substrate 102) supplies gate current from the gate electrode 51G to the cathode electrode 61K, and the lighted state is maintained while the drive IC keeps causing current higher than or equal to a holding current to flow between the anode electrode 41A and the cathode electrode 61K. In the first embodiment, the light emission from the light-emitting thyristor 10 is mainly caused by the recombination of a hole in the active layer 1012 and an electron moving from the N-type gate layer 1022 into the active layer 1012. Light generated by the recombination passes through the second semiconductor layer 1020, the third semiconductor layer 1030 and the fourth semiconductor layer 1040 and then exits upward in FIG. 2.

When the light-emitting thyristor 10 is in the lighted state, the recombination of an electron and a hole occurs also in the third semiconductor layer (P-type gate layer) 1030 and the N-type gate layer 1022. However, mobility of holes as carriers in the active layer 1012 is low since the impurity concentration IMac of the active layer 1012 is set higher than the impurity concentration IMpg of the third semiconductor layer (P-type gate layer) 1030 and the impurity concentration IMng of the second semiconductor layer (N-type gate layer) 1020 as indicated by the aforementioned conditional expressions (1) and (2). Thus, in the active layer 1012, the recombination occurs at an occurrence probability higher than those in the third semiconductor layer 1030 and the second semiconductor layer 1020. Namely, if the impurity concentration IMac of the active layer 1012 is set higher than the impurity concentration IMpg of the third semiconductor layer 1030 and the impurity concentration IMng of the second semiconductor layer 1020, the concentration of carries (holes in FIG. 2) in the active layer 1012 increases, and accordingly, the occurrence probability of the recombination of an electron and a hole becomes high.

Further, in a case where the band gap BGh of the hole barrier layer 1021 is wider than the band gap BGng of the N-type gate layer 1022 as indicated by the aforementioned conditional expression (6) or conditional expressions (7) and (8), an energy barrier occurs against holes moving in the P-type active layer 1012 towards the second semiconductor layer 1020. Namely, since the hole barrier layer 1021 with the wide band gap has the function as a barrier layer limiting the passage of holes, it is possible to inhibit holes from leaking out from the P-type active layer 1012 to the N-type gate layer 1022. Accordingly, the decrease in the amount of holes in the active layer 1012 is inhibited and the occurrence probability of the recombination of a hole and an electron in the active layer 1012 becomes high.

(1-3) Effect

As described above, the light-emitting thyristor 10 includes the hole barrier layer 1021 satisfying the band gap condition BGac<BGh as indicated by the conditional expression (6) or the conditional expressions (7) and (8). Further, in the example of FIG. 2, the hole barrier layer 1021 is a semiconductor layer of the N type, which is a conductivity type different from the P type as the conductivity type of the active layer 1012, and is arranged on an inner side of the active layer 1012 (i.e., the side opposite to the anode layer 1011 in FIG. 2). According to such structure, an effect of confining holes as carries in the active layer 1012 is obtained. Accordingly, the probability of the recombination of a hole in the active layer 1012 heading towards the N-type gate layer 1022 with an electron in the active layer 1012 increases and the luminous efficiency rises. Consequently, the light emission amount of the light-emitting thyristor 10 increases.

Further, in the light-emitting thyristor 10, the impurity concentration IMpg of the third semiconductor layer (P-type gate layer) 1030 and the impurity concentration IMng of the second semiconductor layer 1020 are set low and the impurity concentration IMac of the active layer 1012 is set high as indicated by the conditional expressions (1) and (2). Thus, the mobility of carriers in the third semiconductor layer (P-type gate layer) 1030 and the second semiconductor layer 1020 becomes high and the occurrence probability of the recombination in the third semiconductor layer (P-type gate layer) 1030 and the second semiconductor layer 1020 becomes low. Meanwhile, the mobility of carriers in the active layer 1012 becomes low and the occurrence probability of the recombination in the active layer 1012 becomes high. Accordingly, the occurrence probability of the recombination of a hole and an electron in the active layer 1012 becomes high and the luminous efficiency rises. Consequently, the light emission amount of the light-emitting thyristor 10 increases.

Furthermore, in the light-emitting thyristor 10, the active layer 1012 is formed with a P-type semiconductor, and thus the impurity concentration IMac can be set at high concentration (e.g., $1 \times 10^{19}$ $cm^{-3}$). Accordingly, the amount of holes in the active layer 1012 increases, the occurrence probability of the recombination in the active layer 1012 increases, and the luminous efficiency rises. Consequently, the light emission amount of the light-emitting thyristor 10 increases.

Moreover, in the light-emitting thyristor 10, the active layer 1012 is formed in a lower part of the light-emitting thyristor 10 as a semiconductor multilayer structure, namely, on a side closer to the substrate part 101. In this case, the area of the active layer 1012 can be made large, and thus the light emission amount of light generated in the active layer 1012 can be increased.

(1-4) First Modification of First Embodiment

Figure 4:
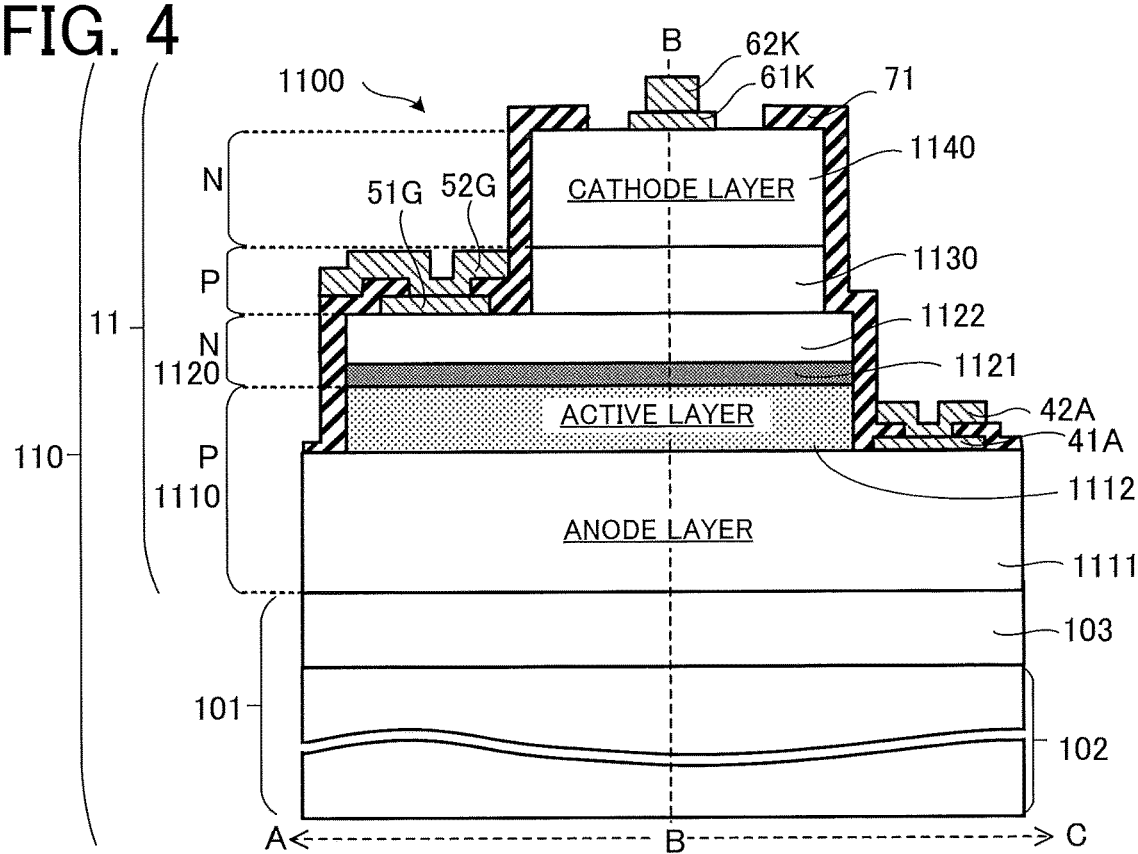
FIG. 4 is a schematic cross-sectional view showing the structure of a light-emitting thyristor according to a first modification of the first embodiment.

FIG. 4 is a schematic cross-sectional view showing the structure of a light-emitting thyristor 11 according to a first modification of the first embodiment (namely, the structure of a cross-section taken along the line A-B-C in FIG. 1). A semiconductor device 1100 includes a plurality of light-emitting thyristors 11. A light-emitting element chip 110 includes the substrate part 101 and the semiconductor device 1100. The light-emitting thyristor 11 differs from the light-emitting thyristor 10 shown in FIG. 2 in that a second semiconductor layer (N-type gate layer) 1120 is formed in a wide region, namely, a wide region including a formation region of the gate electrode 51G while a third semiconductor layer (P-type gate layer) 1130 is formed in a narrow region. Except for this feature, the light-emitting thyristor 11 in FIG. 4 is the same as the light-emitting thyristor 10 in FIG. 2.

The light-emitting thyristor 11 in FIG. 4 includes a P-type first semiconductor layer 1110, the N-type second semiconductor layer 1120, the P-type third semiconductor layer (P-type gate layer) 1130, and an N-type fourth semiconductor layer (cathode layer) 1140. The first semiconductor layer 1110 includes an anode layer 1111 and an active layer 1112. The second semiconductor layer 1120 includes a hole barrier layer 1121 and an N-type gate layer 1122. The first to fourth semiconductor layers 1110, 1120, 1130 and 1140 of the light-emitting thyristor 11 shown in FIG. 4 are formed with the same semiconductor materials as the first to fourth semiconductor layers 1010, 1020, 1030 and 1040 of the light-emitting thyristor 10 shown in FIG. 2. Thus, the light-emitting thyristor 11 shown in FIG. 4 satisfies the conditional expressions (1) to (8) similarly to the light-emitting thyristor 10 shown in FIG. 2. Accordingly, in the light-emitting thyristor 11 shown in FIG. 4, the light emission amount increases due to the rise in the luminous efficiency similarly to the case of the light-emitting thyristor 10 shown in FIG. 2.

Figure 5:
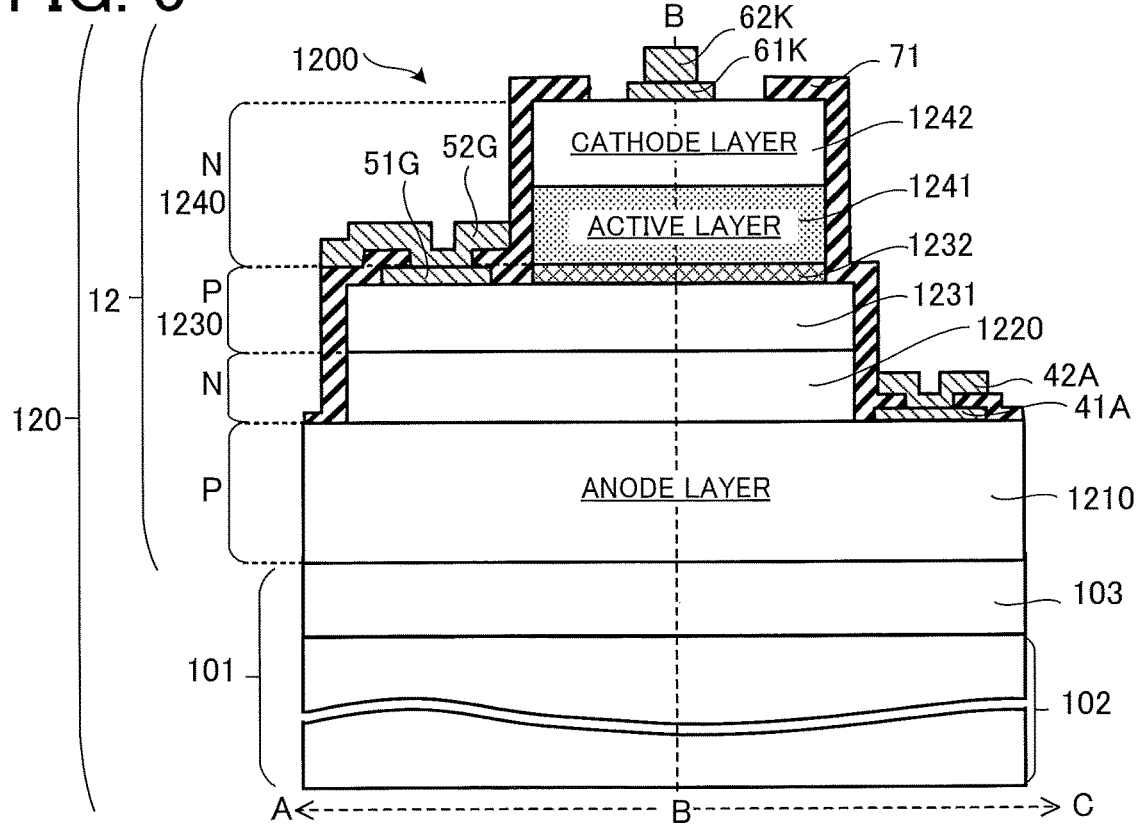
FIG. 5 is a schematic cross-sectional view showing the structure of a light-emitting thyristor according to a second modification of the first embodiment.

Further, in the light-emitting thyristor 11 shown in FIG. 4, the gate electrode 51G is formed on the N-type gate layer 1122, and thus reducing contact resistance is easier compared to the case where the gate electrode 51G is formed on the P-type gate layer. (1-5) Second Modification of First Embodiment FIG. 5 is a schematic cross-sectional view showing the structure of a light-emitting thyristor 12 according to a second modification of the first embodiment (namely, the structure of a cross-section taken along the line A-B-C in FIG. 1). A semiconductor device 1200 includes a plurality of light-emitting thyristors 12. A light-emitting element chip 120 includes the substrate part 101 and the semiconductor device 1200.

The light-emitting thyristor 12 includes an N-type first semiconductor layer 1240, a P-type second semiconductor layer 1230 arranged adjacent to the first semiconductor layer 1240, an N-type third semiconductor layer 1220 arranged adjacent to the second semiconductor layer 1230, and a P-type fourth semiconductor layer 1210 arranged adjacent to the third semiconductor layer 1220. The first semiconductor layer 1240 includes a cathode layer 1242 and an N-type active layer 1241 arranged adjacent to the cathode layer 1242. The second semiconductor layer 1230 includes an electron barrier layer 1232 as a P-type barrier layer arranged adjacent to the N-type active layer 1241 and a P-type gate layer 1231 arranged adjacent to the electron barrier layer 1232. The third semiconductor layer 1220 is an N-type gate layer arranged adjacent to the P-type gate layer 1231. The fourth semiconductor layer 1210 is an anode layer arranged adjacent to the third semiconductor layer 1220.

Figure 6:
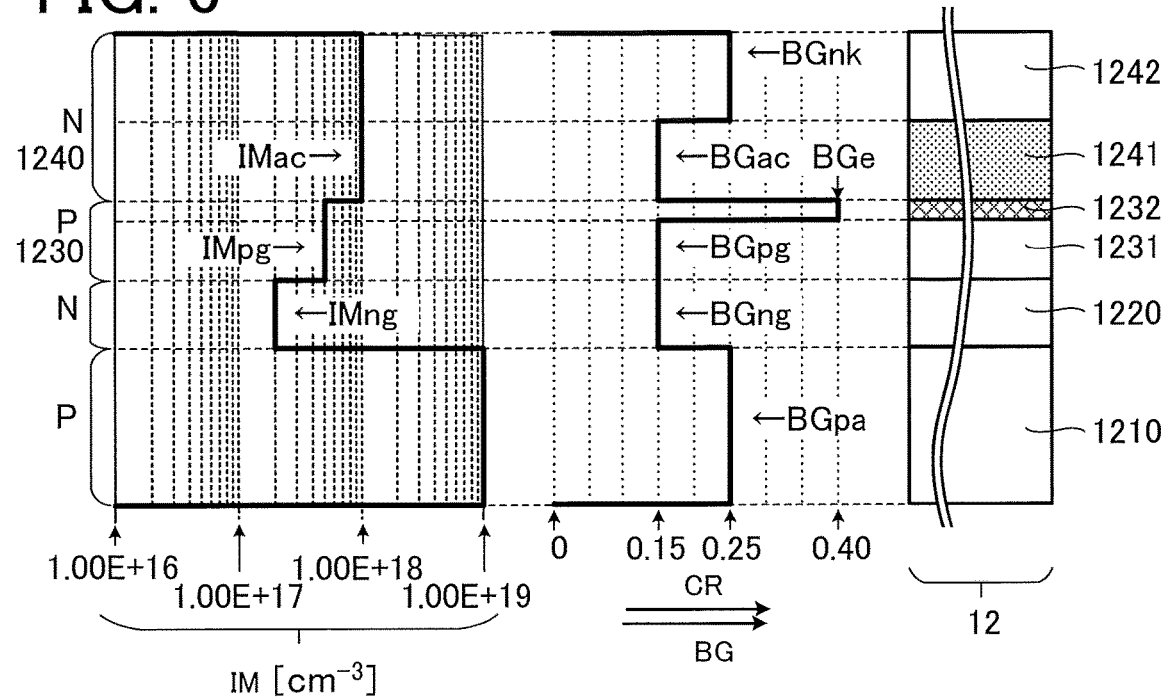
FIG. 6 is a diagram showing an example of the impurity concentration and the Al composition ratio of each semiconductor layer in the light-emitting thyristor in FIG. 5.

FIG. 6 is a diagram showing an example of the impurity concentration IM (cm$^{-3}$) and the Al composition ratio CR of each semiconductor layer in the light-emitting thyristor 12. In the second modification of the first embodiment, let IMpg represent the impurity concentration of the second semiconductor layer 1230, IMng represent the impurity concentration of the third semiconductor layer (N-type gate layer) 1220, and IMac represent the impurity concentration of the active layer 1241 of the first semiconductor layer 1240, the light-emitting thyristor 12 is formed to satisfy the aforementioned conditional expressions (1) and (2).

In FIG. 6, the following numerical examples are shown as the impurity concentrations:

$$IMac \approx 1 \times 10^{18} \text{ cm}^{-3}$$

$$IMpg \approx 5 \times 10^{17} \text{ cm}^{-3}$$

$$IMng \approx 2 \times 10^{17} \text{ cm}^{-3}$$

However, the impurity concentrations are not limited to the numerical examples in FIG. 6.

Further, in the second modification of the first embodiment, let CRng represent the Al composition ratio of the third semiconductor layer (N-type gate layer) 1220, CRpg represent the Al composition ratio of the second semiconductor layer 1230, CRac represent the Al composition ratio of the active layer 1241, and CRe represent the Al composition ratio of the electron barrier layer 1232, the light-emitting thyristor 12 is formed to satisfy the following conditional expression (3a):

$$CRac = CRng = CRpg < CRe \quad (3a)$$

However, CRac=CRng=CRpg in the conditional expression (3a) does not necessarily have to be satisfied. The light-emitting thyristor 12 may also be formed to satisfy the following conditional expressions (4a) and (5a) instead of the conditional expression (3a):

$$CRac \leq CRpg < CRe \quad (4a)$$

$$CRac \leq CRng < CRe \quad (5a)$$

The Al composition ratio CR of each semiconductor layer of the light-emitting thyristor 12 corresponds to the band gap BG of each semiconductor layer. Thus, the conditional expressions (3a) to (5a) are equivalent to the following conditional expressions (6a) to (8a) using the band gap:

$$BGac = BGng = BGpg < BGe \quad (6a)$$

$$BGac \leq BGpg < BGe \quad (7a)$$

$$BGac \leq BGng < BGe \quad (8a)$$

where BGpg represents the band gap of the second semiconductor layer 1230, BGng represents the band gap of the third semiconductor layer 1220, BGac represents the band gap of the active layer 1241, and BGe represents the band gap of the electron barrier layer 1232.

In FIG. 6, the following numerical examples are shown as the Al composition ratios:

$$CRac = CRng = CRpg = 0.15$$

$$CRe = 0.40$$

Further, let the Al composition ratio of the cathode layer 1242 be represented as CRnk (corresponding to a band gap BGnk) and the Al composition ratio of the fourth semiconductor layer 1210 be represented as CRpa (corresponding to a band gap BGpa), FIG. 6 shows an example satisfying:

$$CRnk = CPpa = 0.25$$

However, the Al composition ratios are not limited to the numerical examples in FIG. 6.

The reason for providing the P-type electron barrier layer 1232 having a high Al composition ratio CRe and a wide band gap BGe between the N-type active layer 1241 and the P-type gate layer 1231 is that the P-type electron barrier layer 1232 works as a barrier layer against electrons in the N-type active layer 1241 advancing towards the electron barrier layer 1232, the electron confinement effect in the N-type active layer 1241 can be enhanced, and the recombination in the active layer 1241 can be increased.

Further, in a case where the band gap BGe of the electron barrier layer 1232 is wider than the band gaps BGpg and BGng of the P-type gate layer 1231 and the third semiconductor layer (N-type gate layer) 1220 as indicated by the conditional expression (6a) or the conditional expressions (7a) and (8a), electrons that have moved to the active layer 1241 are received efficiently by the electron barrier layer 1232, by which the amount of electrons leaking out from the electron barrier layer 1232 to the P-type gate layer 1231 is reduced. Accordingly, the amount of carriers in the active layer 1241 hardly decreases and the occurrence probability of the recombination in the active layer 1241 becomes high, and thus the light emission amount increases due to the rise in the luminous efficiency.

The fourth to first semiconductor layers 1210, 1220, 1230 and 1240 of the light-emitting thyristor 12 shown in FIG. 5 and FIG. 6 are formed with semiconductor materials similar to those of the first to fourth semiconductor layers 1010, 1020, 1030 and 1040 of the light-emitting thyristor 10 shown in FIG. 2 and FIG. 3. Accordingly, in the light-emitting thyristor 12 shown in FIG. 5 and FIG. 6, the light emission amount increases due to the rise in the luminous efficiency similarly to the case of the light-emitting thyristor 10 shown in FIG. 2 and FIG. 3.

Furthermore, the active layer 1241 is formed in an upper part (i.e., on a side farther from the substrate part 101) of the light-emitting thyristor 12 as a semiconductor multilayer structure and light generated in the active layer 1241 is extracted in the upward direction in FIG. 5. In this case, the number of semiconductor layers through which the light generated in the active layer 1241 need to pass is small, and thus absorption of the light generated in the active layer 1241 can be reduced and light extraction efficiency can be increased.

(1-6) Third Modification of First Embodiment

Figure 7:
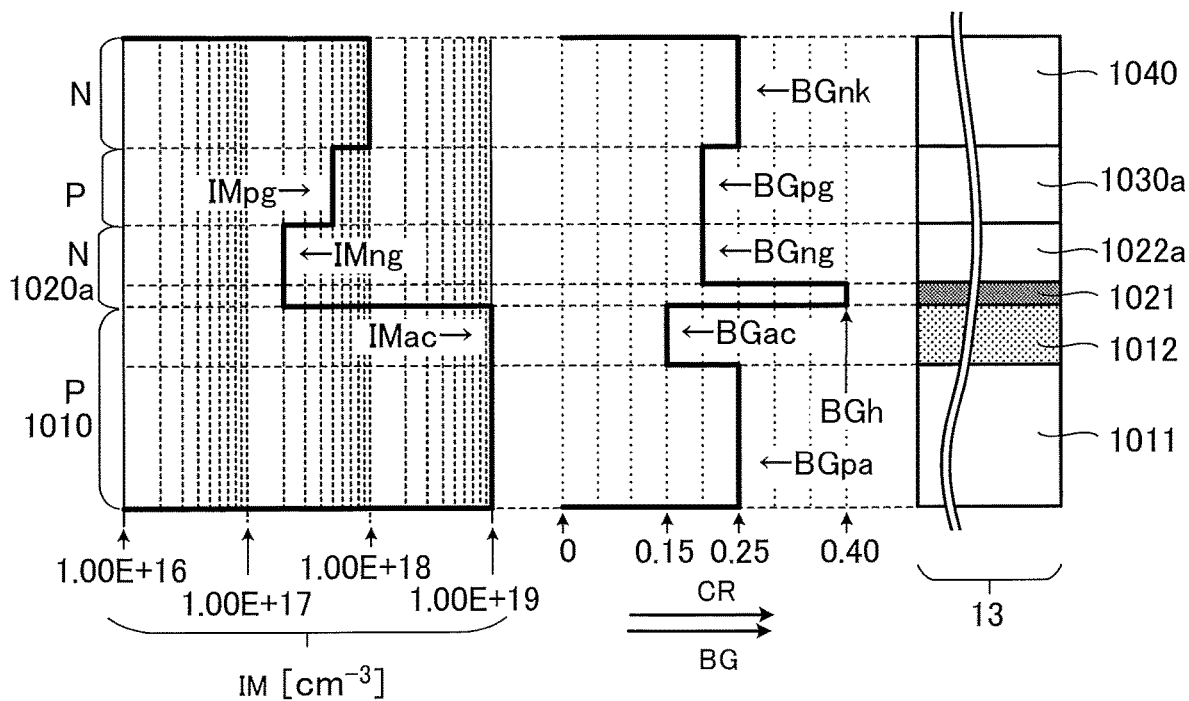
FIG. 7 is a diagram showing an example of the impurity concentration and the Al composition ratio of each semiconductor layer in a light-emitting thyristor according to a third modification of the first embodiment.

FIG. 7 is a diagram showing an example of the impurity concentration IM (cm$^{-3}$) and the Al composition ratio CR of each semiconductor layer in a light-emitting thyristor 13 according to a third modification of the first embodiment. In the third modification of the first embodiment, each component identical to a component of the light-emitting thyristor 10 shown in FIG. 2 and FIG. 3 is assigned the same reference character as in FIG. 2 and FIG. 3. The light-emitting thyristor 13 according to the third modification of the first embodiment differs from the light-emitting thyristor 10 shown in FIG. 2 and FIG. 3 in that the Al composition ratios CRng and CRpg of an N-type gate layer 1022a and a third semiconductor layer (P-type gate layer) 1030a are higher than the Al composition ratios CRac of the active layer 1012.

Let CRpq represent the Al composition ratio of the third semiconductor layer (P-type gate layer) 1030a, CRng represent the Al composition ratio of the N-type gate layer 1022a, CRac represent the Al composition ratio of the active layer 1012, and CRh represent the Al composition ratio of the hole barrier layer 1021, the light-emitting thyristor 13 according to the third modification of the first embodiment is formed to satisfy the following conditional expression (3b):

$$CRac < CRng = CRpg < CRh \quad (3b)$$

However, CRng=CRpg in the conditional expression (3b) does not necessarily have to be satisfied. The light-emitting thyristor 13 may also be formed to satisfy the following conditional expressions (4b) and (5b) instead of the conditional expression (3b):

$$CRac < CRpg < CRh \quad (4b)$$

$$CRac < CRng < CRh \quad (5b)$$

The Al composition ratio CR of each semiconductor layer of the light-emitting thyristor 13 corresponds to the band gap BG of each semiconductor layer. Thus, the conditional expressions (3b) to (5b) are equivalent to the following conditional expressions (6b) to (8b) using the band gap:

$$BGac < BGng = BGpg < BGh \quad (6b)$$

$$BGac < BGpg < BGh \quad (7b)$$

$$BGac < BGng < BGh \quad (8b)$$

where BGpg represents the band gap of the third semiconductor layer (P-type gate layer) 1030a, BGng represents the band gap of the N-type gate layer 1022a, BGac represents the band gap of the active layer 1012, and BGh represents the band gap of the hole barrier layer 1021.

In FIG. 7, the following numerical examples are shown as the Al composition ratios:

$$CRac \approx 0.15$$

$$CRng = CRpg \approx 0.20$$

$$CRh \approx 0.40$$

Further, let the Al composition ratio of the anode layer 1011 be represented as CRpa (corresponding to a band gap BGpa) and the Al composition ratio of the fourth semiconductor layer 1040 be represented as CRnk (corresponding to a band gap BGnk), FIG. 7 shows an example satisfying:

$$CRpa = CRnk \approx 0.25$$

However, the Al composition ratios are not limited to the numerical examples in FIG. 7.

The first to fourth semiconductor layers 1010, 1020a, 1030a and 1040 of the light-emitting thyristor 13 shown in FIG. 7 are formed with semiconductor materials similar to those of the first to fourth semiconductor layers 1010, 1020, 1030 and 1040 of the light-emitting thyristor 10 shown in FIG. 2. Accordingly, in the light-emitting thyristor 13 shown in FIG. 7, the light emission amount increases due to the rise in the luminous efficiency similarly to the case of the light-emitting thyristor 10 shown in FIG. 2 and FIG. 3.

Further, since the Al composition ratios CRng and BGpg in the N-type gate layer 1022a and the third semiconductor layer (P-type gate layer) 1030a are set higher than the Al composition ratio CRac in the active layer 1012 in the light-emitting thyristor 13 shown in FIG. 7, the N-type gate layer 1022a and the third semiconductor layer (P-type gate layer) 1030a have high optical transmittance. Accordingly, light emitted from the active layer 1012 can be radiated upward in FIG. 7 with high efficiency.

(2) Second Embodiment (2-1) Configuration

Figure 8:
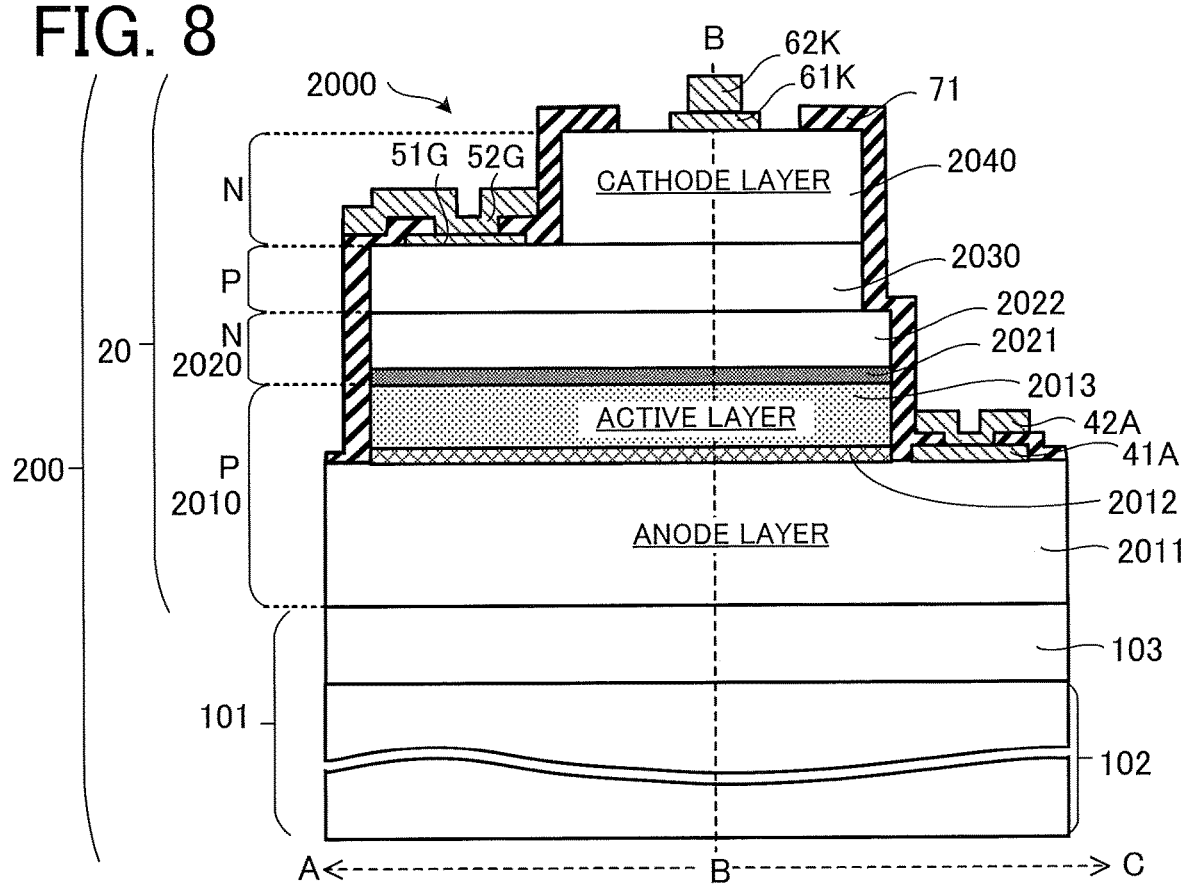
FIG. 8 is a schematic cross-sectional view showing the structure of a light-emitting thyristor according to a second embodiment of the present invention.

FIG. 8 is a schematic cross-sectional view showing the structure of a light-emitting thyristor 20 according to a second embodiment (namely, the structure of a cross-section taken along the line A-B-C in FIG. 1). As shown in FIG. 8, the light-emitting thyristor 20 includes a P-type first semiconductor layer 2010, an N-type second semiconductor layer 2020 arranged adjacent to the first semiconductor layer 2010, a P-type third semiconductor layer 2030 arranged adjacent to the second semiconductor layer 2020, and an N-type fourth semiconductor layer 2040 arranged adjacent to the third semiconductor layer 2030.

As shown in FIG. 8, the first semiconductor layer 2010 includes an anode layer 2011 arranged on the substrate part 101, an electron barrier layer 2012 as a P-type barrier layer arranged adjacent to the anode layer 2011, and a P-type active layer 2013 arranged adjacent to the electron barrier layer 2012. The second semiconductor layer 2020 includes a hole barrier layer 2021 of the N type as a conductivity type different from that of the active layer 2013 and an N-type gate layer 2022 arranged adjacent to the hole barrier layer. The third semiconductor layer 2030 is a P-type gate layer. The fourth semiconductor layer 2040 is a cathode layer.

The light-emitting thyristor 20 according to the second embodiment differs from the light-emitting thyristor 10 shown in FIG. 2 and FIG. 3 in including the electron barrier layer 2012. Except for this feature, the light-emitting thyristor 20 according to the second embodiment is the same as the light-emitting thyristor 10 according to the first embodiment.

Figure 9:
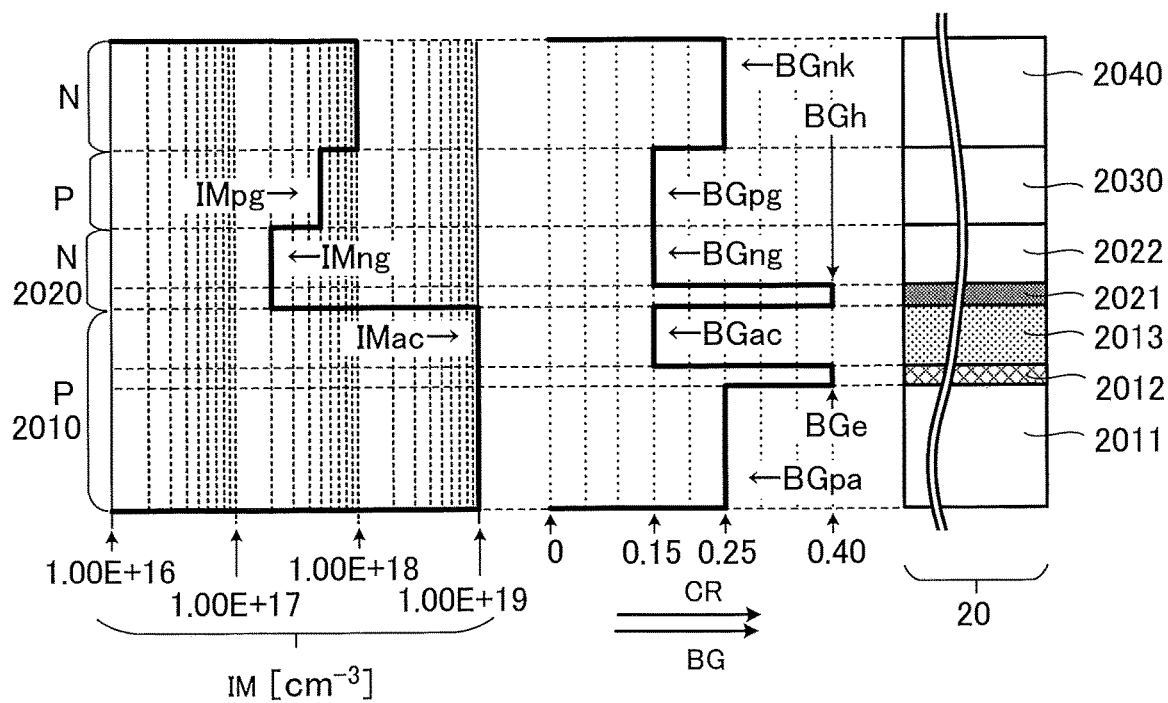
FIG. 9 is a diagram showing an example of the impurity concentration and the Al composition ratio of each semiconductor layer in the light-emitting thyristor in FIG. 8.

FIG. 9 is a diagram showing an example of the impurity concentration IM (cm$^{-3}$) and the Al composition ratio CR of each semiconductor layer in the light-emitting thyristor 20 in FIG. 8. Let CRng represent the Al composition ratio of the N-type gate layer 2022, CRpg represent the Al composition ratio of the third semiconductor layer (P-type gate layer) 2030, CRac represent the Al composition ratio of the active layer 2013, CRh represent the Al composition ratio of the hole barrier layer 2021, and CRe represent the Al composition ratio of the electron barrier layer 2012, the light-emitting thyristor 20 satisfies the following conditional expression (3c):

$$CRac=CRng=CRpg<CRh=CRe \quad (3c)$$

However, CRac=CRng=CRpg in the conditional expression (3c) does not necessarily have to be satisfied. The light-emitting thyristor 20 may also be formed to satisfy the following conditional expressions (4c) and (5c) instead of the conditional expression (3c):

$$CRac \le CRpg<CRh=CRe \quad (4c)$$

$$CRac \le CRng<CRh=CRe \quad (5c)$$

Further, CRh=CRe does not necessarily have to be satisfied.

The Al composition ratio CR of each semiconductor layer of the light-emitting thyristor 20 corresponds to the band gap BG of each semiconductor layer. Thus, the conditional expressions (3c) to (5c) are equivalent to the following conditional expressions (6c) to (8c) using the band gap:

$$BGac=BGng=BGpg<BGh=BGe \quad (6c)$$

$$BGac \le BGpg<EGh=BGe \quad (7c)$$

$$BGac \le BGng<BGh=BGe \quad (8c)$$

where BGpg represents the band gap of the third semiconductor layer (P-type gate layer) 2030, BGng represents the band gap of the N-type gate layer 2022, BGac represents the band gap of the active layer 2013, BGh represents the band gap of the hole barrier layer 2021, and BGe represents the band gap of the electron barrier layer 2012.

In FIG. 9, the following numerical examples are shown as the Al composition ratios:

$$CRac=CRng=CRpg \approx 0.15$$

$$CRh=CRe \approx 0.40$$

Further, let the Al composition ratio of the anode layer 2011 be represented as CRpa (corresponding to a band gap BGpa) and the Al composition ratio of the fourth semiconductor layer 2040 be represented as CRnk (corresponding to a band gap BGnk), FIG. 9 shows an example satisfying:

$$CRpa=CRnk \approx 0.25$$

However, the Al composition ratios are not limited to the numerical examples in FIG. 9.

The reason for providing the P-type electron barrier layer 2012 having a high Al composition ratio CRe and a wide band gap BGe between the active layer 2013 and the anode layer 2011 is that the electron barrier layer 2012 works as a barrier layer against electrons in the active layer 2013 advancing towards the electron barrier layer 2012, the electron confinement effect in the active layer 2013 can be enhanced, and consequently the occurrence probability of the recombination of an electron and a hole in the active layer 2013 can be increased.

Further, in a case where the band gap BGh of the hole barrier layer 2021 is wider than the band gaps BGng and BGpg of the N-type gate layer 2022 and the third semiconductor layer (P-type gate layer) 2030 as indicated by the aforementioned conditional expression (6c) or conditional expressions (7c) and (8c), holes in the active layer 2013 that have moved towards the N-type gate layer 2022 are received efficiently by the hole barrier layer 2021, by which the amount of holes leaking out to the N-type gate layer 2022 through the hole barrier layer 2021 is reduced. Namely, since the hole barrier layer 2021 satisfying the conditional expression (6c) or the conditional expressions (7c) and (8c) has the function as a barrier layer limiting the passage of carriers, holes as carriers moving in the active layer 2013 are inhibited from leaking out to the N-type gate layer 2022. Thus, the amount of carriers in the active layer 2013 hardly decreases and the occurrence probability of the recombination in the active layer 2013 becomes high and accordingly the luminous efficiency rises. Consequently, the light emission amount of the light-emitting thyristor 20 increases.

As described above, in the light-emitting thyristor 20, due to the hole barrier layer 2021 satisfying BGac<BGh as indicated by the conditional expression (6c) or the conditional expressions (7c) and (8c), an energy barrier occurs against holes in the active layer 2013 moving towards the hole barrier layer 2021. Further, due to the condition BGac<BGe satisfied by the electron barrier layer 2012, the electron barrier layer 2012 works as a barrier layer against electrons in the active layer 2013 advancing towards the electron barrier layer 2012 and the electron confinement effect in the P-type active layer 2013 can be enhanced. Accordingly, the probability of the recombination of an electron heading from the cathode layer 2040 to the anode layer 2011 with a hole in the active layer 2013 becomes high, the luminous efficiency rises, and consequently, the light emission amount increases.

Further, in the light-emitting thyristor 20, the impurity concentration IMng of the second semiconductor layer 2020 and the impurity concentration IMpg of the third semiconductor layer (P-type gate layer) 2030 are set low and the impurity concentration IMac of the active layer 2013 is set high as shown in FIG. 9. Thus, the mobility of carriers in the second semiconductor layer 2020 and the third semiconductor layer (P-type gate layer) 2030 become high and the recombination in the second semiconductor layer 2020 and the third semiconductor layer (P-type gate layer) 2030 are inhibited. Further, the mobility of carriers in the active layer 2013 becomes low and the recombination in the active layer 2013 increases. Accordingly, the occurrence probability of the recombination of an electron and a hole in the active layer 2013 becomes high and the luminous efficiency rises, and consequently, the light emission amount increases.

(2-2) First Modification of Second Embodiment

Figure 10:
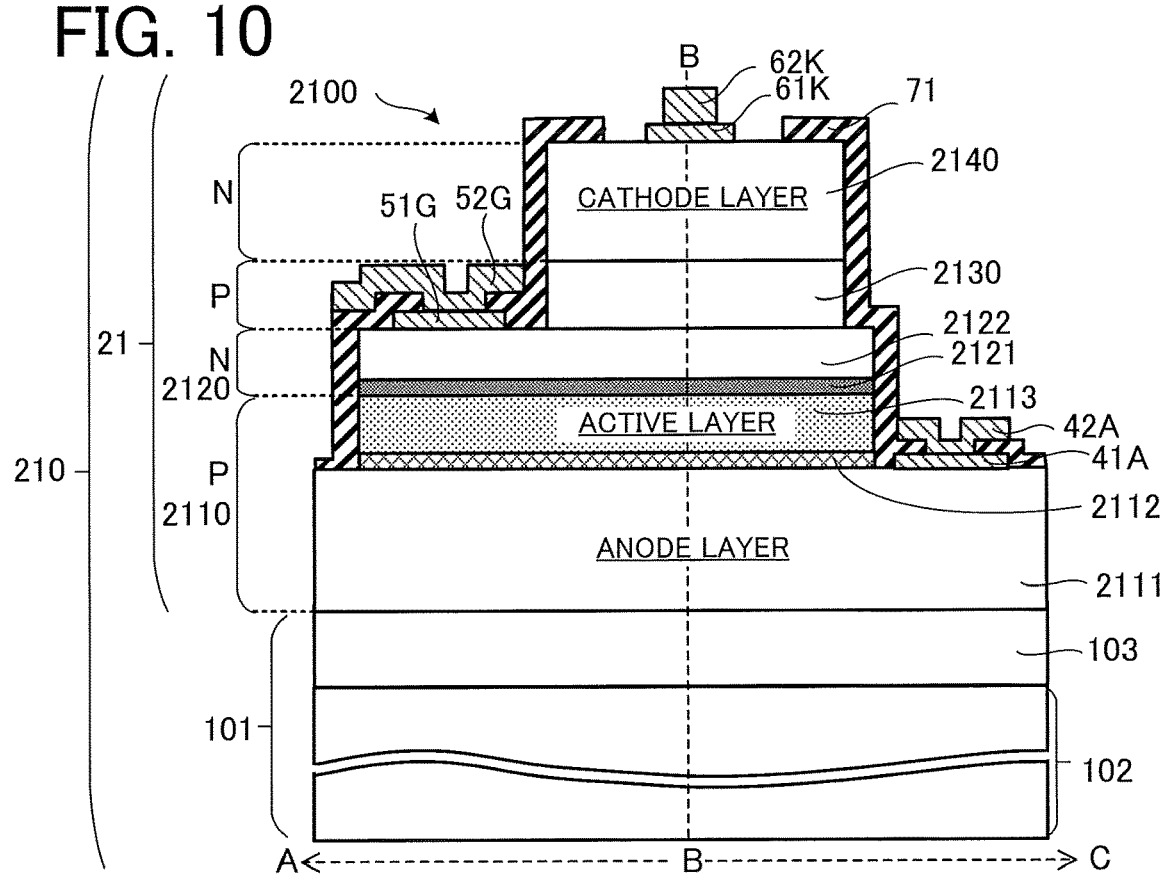
FIG. 10 is a schematic cross-sectional view showing the structure of a light-emitting thyristor according to a first modification of the second embodiment

FIG. 10 is a schematic cross-sectional view showing the structure of a light-emitting thyristor 21 according to a first modification of the second embodiment (namely, the structure of a cross-section taken along the line A-B-C in FIG. 1). A semiconductor device 2100 includes a plurality of light-emitting thyristors 21. A light-emitting element chip 210 includes the substrate part 101 and the semiconductor device 2100. The light-emitting thyristor 21 differs from the light-emitting thyristor 20 shown in FIG. 8 and FIG. 9 in that a second semiconductor layer (N-type gate layer) 2120 is formed in a wide region, namely, a wide region including the formation region of the gate electrode 51G while a third semiconductor layer (P-type gate layer) 2130 is formed in a narrow region. Except for this feature, the light-emitting thyristor 21 shown in FIG. 10 is the same as the light-emitting thyristor 20 shown in FIG. 8 and FIG. 9.

The light-emitting thyristor 21 shown in FIG. 10 includes a P-type first semiconductor layer 2110, the N-type second semiconductor layer 2120, the P-type third semiconductor layer (P-type gate layer) 2130, and an N-type fourth semiconductor layer (cathode layer) 2140. The first semiconductor layer 2110 includes an anode layer 2111, an electron barrier layer 2112 and an active layer 2113. The second semiconductor layer 2120 includes a hole barrier layer 2121 and an N-type gate layer 2122. The first to fourth semiconductor layers 2110, 2120, 2130 and 2140 of the light-emitting thyristor 21 shown in FIG. 10 are formed with the same semiconductor materials as the first to fourth semiconductor layers 2010, 2020, 2030 and 2040 of the light-emitting thyristor 20 shown in FIG. 8. Thus, the light-emitting thyristor 21 shown in FIG. 10 satisfies the conditional expressions (1), (2) and (3c) to (8c) similarly to the light-emitting thyristor 20 shown in FIG. 8. Accordingly, in the light-emitting thyristor 21 shown in FIG. 10, the light emission amount increases due to the rise in the luminous efficiency similarly to the case of the light-emitting thyristor 20 shown in FIG. 8.

Further, in the light-emitting thyristor 21 shown in FIG. 10, the gate electrode 51G is formed on the N-type gate layer 2122, and thus reducing the contact resistance is easier compared to the case where the gate electrode 51G is formed on the P-type gate layer.

(2-3) Second Modification of Second Embodiment

Figure 11:
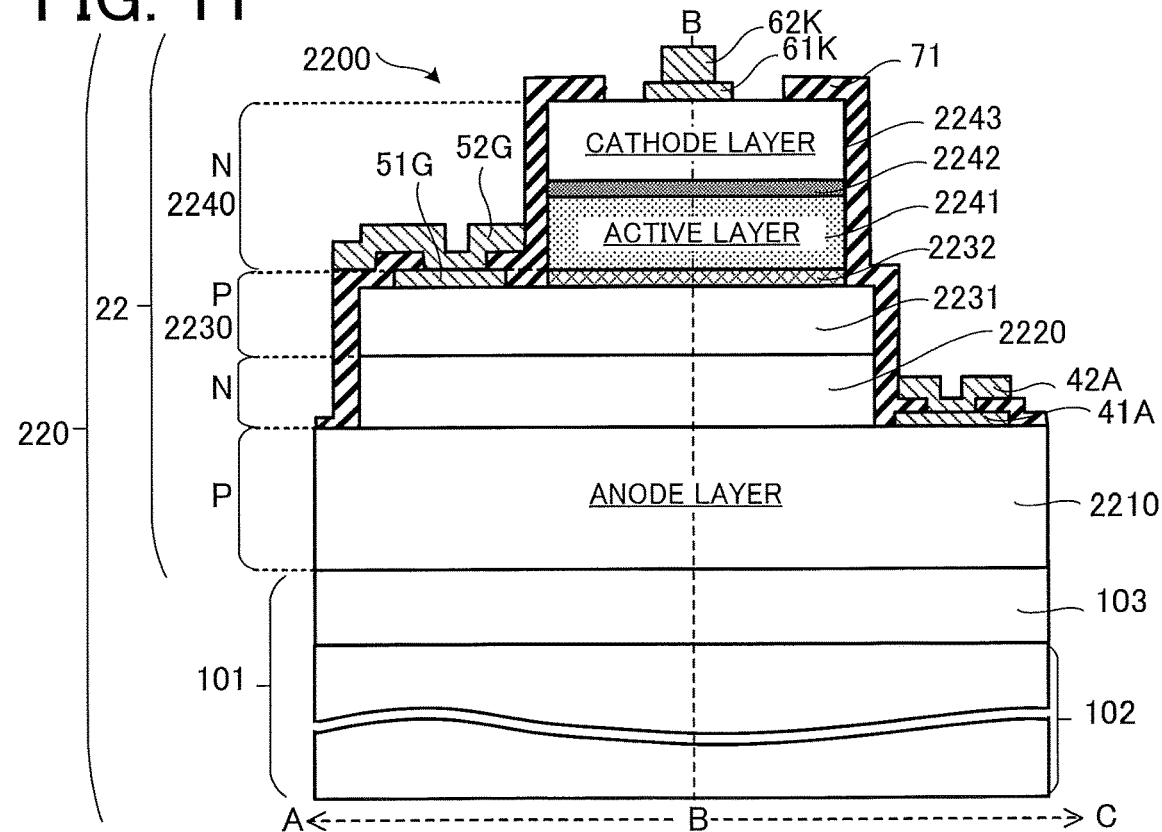
FIG. 11 is a schematic cross-sectional view showing the structure of a light-emitting thyristor according to a second modification of the second embodiment.

FIG. 11 is a schematic cross-sectional view showing the structure of a light-emitting thyristor 22 according to a second modification of the second embodiment (namely, the structure of a cross-section taken along the line A-B-C in FIG. 1). A semiconductor device 2200 includes a plurality of light-emitting thyristors 22. A light-emitting element chip 220 includes the substrate part 101 and the semiconductor device 2200.

The light-emitting thyristor 22 includes an N-type first semiconductor layer 2240, a P-type second semiconductor layer 2230 arranged adjacent to the first semiconductor layer 2240, an N-type third semiconductor layer 2220 arranged adjacent to the second semiconductor layer 2230, and a P-type fourth semiconductor layer 2210 arranged adjacent to the third semiconductor layer 2220. The first semiconductor layer 2240 includes a cathode layer 2243, an N-type hole barrier layer 2242 and an N-type active layer 2241. The second semiconductor layer 2230 includes an electron barrier layer 2232 as a P-type first layer and a P-type gate layer 2231. The third semiconductor layer 2220 is an N-type gate layer. The fourth semiconductor layer 2210 is an anode layer.

Figure 12:
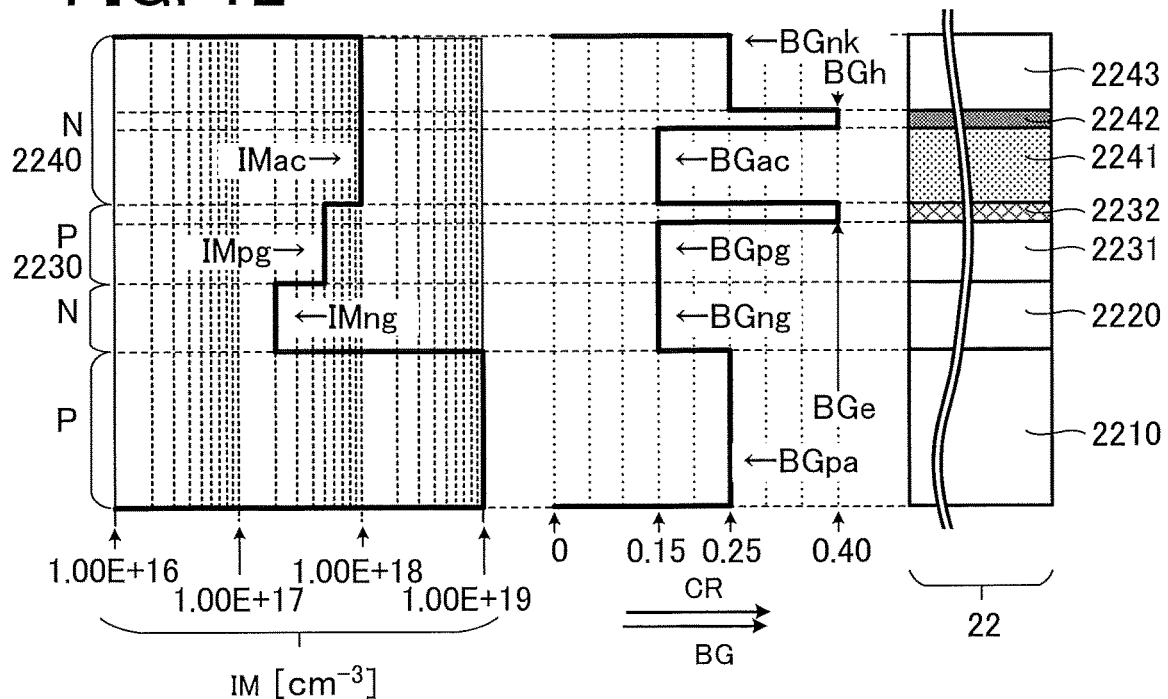
FIG. 12 is a diagram showing an example of the impurity concentration and the Al composition ratio of each semiconductor layer in the light-emitting thyristor in FIG. 11.

FIG. 12 is a diagram showing an example of the impurity concentration IM ($cm^{-3}$) and the Al (aluminum) composition ratio CR of each semiconductor layer in the light-emitting thyristor 22. In the second modification of the second embodiment, let IMpg represent the impurity concentration of the second semiconductor layer 2230, IMng represent the impurity concentration of the third semiconductor layer (N-type gate layer) 2220, and IMac represent the impurity concentration of the active layer 2241 of the first semiconductor layer 2240, the light-emitting thyristor 22 is formed to satisfy the aforementioned conditional expressions (1) and (2).

In FIG. 12, the following numerical examples are shown as the impurity concentrations:

$IMac \approx 1 \times 10^{18}$ $cm^{-3}$ $IMpg \approx 5 \times 10^{17}$ $cm^{-3}$ $IMng \approx 2 \times 10^{17}$ $cm^{-3}$ However, the impurity concentrations are not limited to the numerical examples in FIG. 12.

Further, in the second modification of the second embodiment, let CRng represent the Al composition ratio of the third semiconductor layer (N-type gate layer) 2220, CRpg represent the Al composition ratio of the second semiconductor layer 2230, CRac represent the Al composition ratio of the active layer 2241, CRe represent the Al composition ratio of the electron barrier layer 2232, and CRh represent the Al composition ratio of the hole barrier layer 2242, the light-emitting thyristor 22 is formed to satisfy the following conditional expression (3d):

$$CRac = CRng = CRpg < CRe = CRh \qquad (3d)$$

However, CRac=CRng=CRpg in the conditional expression (3d) does not necessarily have to be satisfied. The light-emitting thyristor 22 may also be formed to satisfy the following conditional expressions (4d) and (5d) instead of the conditional expression (3d):

$$CRac \leq CRpg < CRe = CRh \qquad (4d)$$

$$CRac \leq CRng < CRe = CRh \qquad (5d)$$

The Al composition ratio CR of each semiconductor layer of the light-emitting thyristor 22 corresponds to the band gap BG of each semiconductor layer. Thus, the conditional expressions (3d) to (5d) are equivalent to the following conditional expressions (6d) to (8d) using the band gap:

$$BGac = BGng = BGpg < BGe = BGh \qquad (6d)$$

$$BGac \leq BGpg < BGe = BGh \qquad (7d)$$

$$BGac \leq BGng < BGe = BGh \qquad (8d)$$

Here, BGpg represents the band gap of the second semiconductor layer 2230, BGng represents the band gap of the third semiconductor layer 2220, BGac represents the band gap of the active layer 2241, and BGe represents the band gap of the electron barrier layer 2232.

In FIG. 12, the following numerical examples are shown as the Al composition ratios:

CRac=CRng=CRpg≈0.15

CRe=CRh≈0.40

Further, let the Al composition ratio of the cathode layer 2243 be represented as CRnk (corresponding to a band gap BGnk) and the Al composition ratio of the fourth semiconductor layer 2210 be represented as CRpa (corresponding to a band gap BGpa), FIG. 12 shows an example satisfying:

CRnk=CRpa≈0.25

However, the Al composition ratios are not limited to the numerical examples in FIG. 12.

The fourth to first semiconductor layers 2210, 2220, 2230 and 2240 of the light-emitting thyristor 22 shown in FIG. 11 and FIG. 12 are formed with semiconductor materials similar to those of the first to fourth semiconductor layers 2010, 2020, 2030 and 2040 of the light-emitting thyristor 20 shown in FIG. 8 and FIG. 9. Accordingly, in the light-emitting thyristor 22 in FIG. 11 and FIG. 12, the light emission amount increases due to the rise in the luminous efficiency similarly to the case of the light-emitting thyristor 20 in FIG. 8 and FIG. 9.

Furthermore, the active layer 2241 is formed in an upper part (i.e., on a side farther from the substrate part 101) of the light-emitting thyristor 22 as a semiconductor multilayer structure and light generated in the active layer 2241 is extracted in the upward direction in FIG. 11, by which the absorption of the light generated in the active layer 2241 is reduced and the light extraction efficiency is increased.

The reason for providing the P-type electron barrier layer 2232 having a high Al composition ratio CRe and a wide band gap BGe between the N-type active layer 2241 and the P-type gate layer 2231 is that the P-type electron barrier layer 2232 works as a barrier layer against electrons in the N-type active layer 2241 advancing towards the electron barrier layer 2232, the electron confinement effect in the N-type active layer 2241 can be enhanced, and the recombination in the active layer 2241 can be increased.

Further, in a case where the band gap BGe of the electron barrier layer 2232 is wider than the band gaps BGpg and BGng of the P-type gate layer 2231 and the third semiconductor layer (N-type gate layer) 2220 as indicated by the conditional expression (6d) or the conditional expressions (7d) and (8d), electrons that have moved to the active layer 2241 are received efficiently by the electron barrier layer 2232, by which the amount of electrons leaking out from the electron barrier layer 2232 to the P-type gate layer 2231 is reduced. Accordingly, the amount of carriers in the active layer 2241 hardly decreases and the occurrence probability of the recombination in the active layer 2241 becomes high, and thus the light emission amount increases due to the rise in the luminous efficiency.

Further, in a case where the band gap BGh of the hole barrier layer 2242 is wider than the band gap BGnk of the cathode layer 2243 as shown in FIG. 12, an energy barrier occurs against holes moving in the active layer 2241 towards the cathode layer 2243. Namely, since the hole barrier layer 2242 with the wide band gap has the function as a barrier layer limiting the passage of holes, it is possible to inhibit holes from leaking out from the active layer 2241 to the cathode layer 2243. Accordingly, the decrease in the amount of holes in the active layer 2241 is inhibited and the occurrence probability of the recombination of a hole and an electron in the active layer 2241 becomes high.

The fourth to first semiconductor layers 2210, 2220, 2230 and 2240 of the light-emitting thyristor 22 shown in FIG. 11 and FIG. 12 are formed with semiconductor materials similar to those of the first to fourth semiconductor layers 2010, 2020, 2030 and 2040 of the light-emitting thyristor 20 shown in FIG. 8 and FIG. 9. Accordingly, in the light-emitting thyristor 22 shown in FIG. 11 and FIG. 12, the light emission amount increases due to the rise in the luminous efficiency similarly to the case of the light-emitting thyristor 20 shown in FIG. 8 and FIG. 9.

Furthermore, the active layer 2241 is formed in an upper part (i.e., on a side farther from the substrate part 101) of the light-emitting thyristor 22 as a semiconductor multilayer structure and light generated in the active layer 2241 is extracted in the upward direction in FIG. 11, by which the absorption of the light generated in the active layer 2241 is reduced and the light extraction efficiency is increased.

(2-4) Third Modification of Second Embodiment

Figure 13:
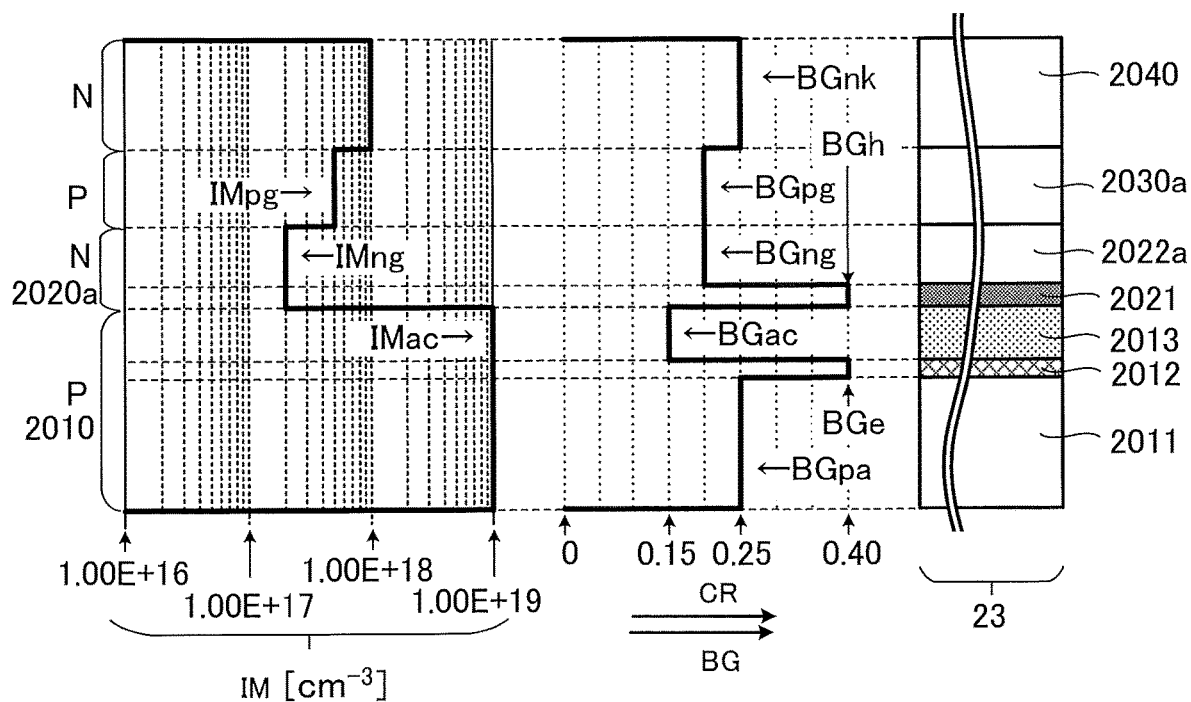
FIG. 13 is a diagram showing an example of the impurity concentration and the Al composition ratio of each semiconductor layer in a light-emitting thyristor according to a third modification of the second embodiment.

FIG. 13 is a diagram showing an example of the impurity concentration IM ($cm^{-3}$) and the Al composition ratio CR of each semiconductor layer in a light-emitting thyristor 23 according to a third modification of the second embodiment. The light-emitting thyristor 23 according to the third modification of the second embodiment differs from the light-emitting thyristor 20 shown in FIG. 8 and FIG. 9 in that the Al composition ratios CRng and CRpg of an N-type gate layer 2022a of a second semiconductor layer 2020a and a third semiconductor layer (P-type gate layer) 2030a are higher than the Al composition ratios CRac of the active layer 2013. Except for this feature, the light-emitting thyristor 23 according to the third modification of the second embodiment is the same as the light-emitting thyristor 20 shown in FIG. 8 and FIG. 9.

The first to fourth semiconductor layers 2010, 2020a, 2030a and 2040 of the light-emitting thyristor 23 shown in FIG. 13 are formed with semiconductor materials similar to those of the first to fourth semiconductor layers 2010, 2020, 2030 and 2040 of the light-emitting thyristor 20 shown in FIG. 8 and FIG. 9. Accordingly, in the light-emitting thyristor 23 shown in FIG. 13, the light emission amount increases due to the rise in the luminous efficiency similarly to the case of the light-emitting thyristor 20 shown in FIG. 8 and FIG. 9.

Further, since the Al composition ratios CRng and BGpg in the N-type gate layer 2022a and the third semiconductor layer (P-type gate layer) 2030a are set higher than the Al composition ratio CRac in the active layer 2013 in the light-emitting thyristor 23 shown in FIG. 13, the N-type gate layer 2022a and the third semiconductor layer (P-type gate layer) 2030a have high optical transmittance. Accordingly, light emitted from the active layer 2013 can be radiated upward in FIG. 13 with high efficiency.

(3) Third Embodiment (3-1) Configuration

Figure 14:
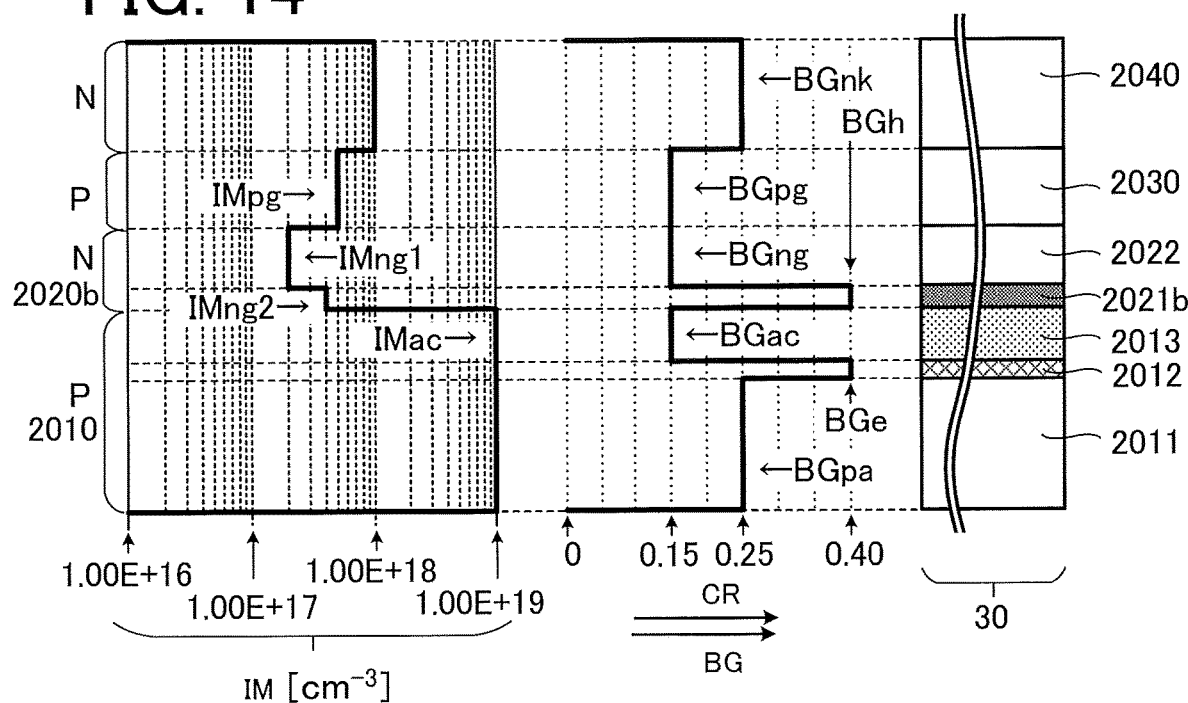
FIG. 14 is a diagram showing an example of the impurity concentration and the Al composition ratio of each semiconductor layer in a light-emitting thyristor according to a third embodiment of the present invention.

FIG. 14 is a diagram showing an example of the impurity concentration IM ($cm^{-3}$) and the Al composition ratio CR of each semiconductor layer in a light-emitting thyristor 30 according to a third embodiment. The light-emitting thyristor 30 according to the third embodiment differs from the light-emitting thyristor 20 according to the second embodiment shown in FIG. 8 in the impurity concentration IMng2 of a hole barrier layer 2021b. Except for this feature, the light-emitting thyristor 30 according to the third embodiment is the same as the light-emitting thyristor 20 according to second embodiment shown in FIG. 8.

The light-emitting thyristor 30 includes the P-type first semiconductor layer 2010, an N-type second semiconductor layer 2020b arranged adjacent to the first semiconductor layer 2010, the P-type third semiconductor layer 2030 arranged adjacent to the second semiconductor layer 2020b, and the N-type fourth semiconductor layer 2040 arranged adjacent to the third semiconductor layer 2030.

The first semiconductor layer 2010 includes the anode layer 2011, the electron barrier layer 2012 as a barrier layer, and the active layer 2013. The second semiconductor layer 2020b includes the hole barrier layer 2021b and the N-type gate layer 2022. The third semiconductor layer 2030 is a P-type gate layer. The fourth semiconductor layer 2040 is a cathode layer.

In the light-emitting thyristor 20 according to the second embodiment, the impurity concentration of the hole barrier layer 2021 and the impurity concentration of the N-type gate layer 2022 were set at the same value. In contrast, in the light-emitting thyristor 30 according to the third embodiment, the impurity concentration IMng2 of the hole barrier layer 2021b is set higher than the impurity concentration IMng1 of the N-type gate layer 2022.

FIG. 15A is a diagram showing the condition of a junction interface between the hole barrier layer 2021 and the N-type gate layer 2022 of the light-emitting thyristor 20 according to the second embodiment. FIG. 15B is a diagram showing the condition of a junction interface between the hole barrier layer 2021b and the N-type gate layer 2022 of the light-emitting thyristor 30 according to the third embodiment. In FIGS. 15A and 15B, Ef represents the Fermi level, Ec represents the energy level of the conduction band, and Ev represents the energy level of the valence band.

In the second embodiment, the impurity concentrations of the hole barrier layer 2021 and the N-type gate layer 2022 are set at the same value, and thus the Fermi level of the hole barrier layer 2021 and the Fermi level of the N-type gate layer 2022 are also at substantially the same values. However, since the band gaps of the hole barrier layer 2021 and the N-type gate layer 2022 satisfy BGh> BGng, an energy barrier is formed at the junction interface against electrons (e⁻) moving in the conduction band as indicated as the energy level of the conduction band on the right-hand side of FIG. 15A.

Thus, in the third embodiment, the impurity concentration IMng2 of the hole barrier layer 2021b is set higher than the impurity concentration IMng1 of the N-type gate layer 2022. According to this setting, the Fermi level of the hole barrier layer 2021b becomes higher than the Fermi level of the N-type gate layer 2022 as shown on the left-hand side of FIG. 15B. However, in the equilibrium state after junction, the Fermi levels become equal to each other as shown on the right-hand side of FIG. 15B, by which the energy barrier at the junction interface against electrons in the conduction band can be lowered. Accordingly, injection efficiency of electrons from the N-type gate layer 2022 to the active layer 2013 increases. Further, the energy barrier against holes h⁺ moving in the valence band becomes higher than the energy barrier in the case of the second embodiment and the hole confinement effect in the active layer 2013 increases. According to the above-described features, the light-emitting thyristor 30 according to the third embodiment can increase the luminous efficiency further than the light-emitting thyristor 20 according to the second embodiment.

(3-2) First Modification of Third Embodiment

Figure 16:
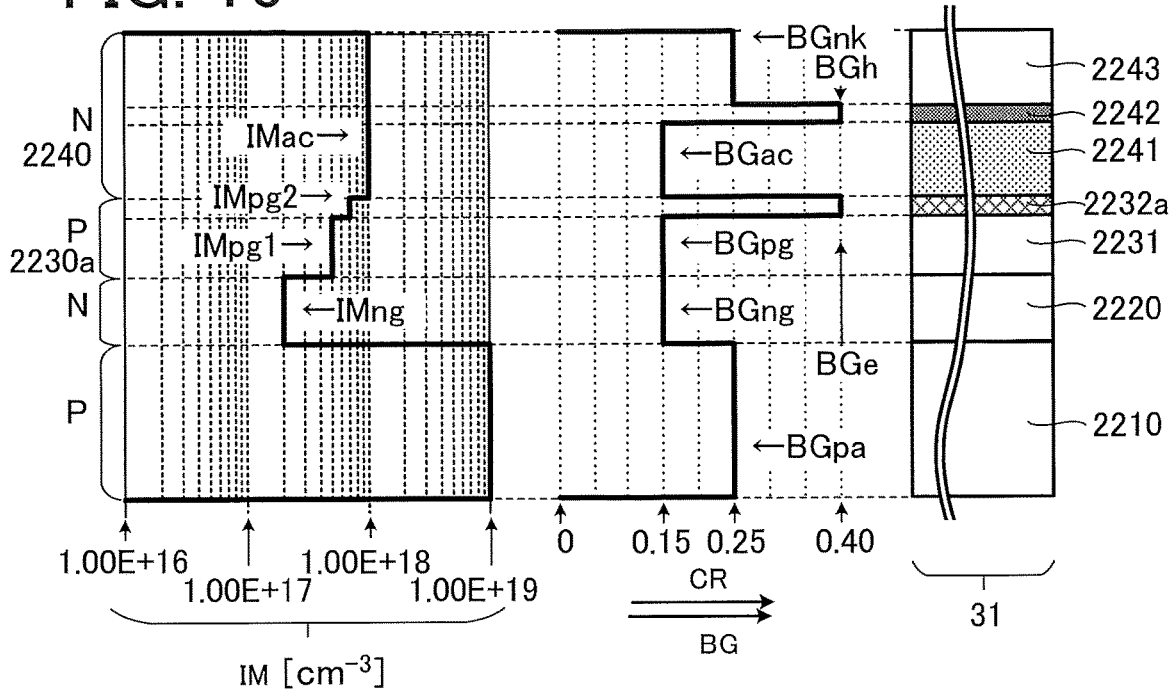
FIG. 16 is a diagram showing an example of the impurity concentration and the Al composition ratio of each semiconductor layer in a light-emitting thyristor according to a first modification of the third embodiment.

FIG. 16 is a diagram showing an example of the impurity concentration IM (cm⁻³) and the Al composition ratio CR of each semiconductor layer in a light-emitting thyristor 31 according to a first modification of the third embodiment. The light-emitting thyristor 31 according to the first modification of the third embodiment differs from the light-emitting thyristor 22 according to the second modification of the second embodiment shown in FIG. 12 in the impurity concentration IMpg2 of an electron barrier layer 2232a. Except for this feature, the light-emitting thyristor 31 according to the first modification of the third embodiment is the same as the light-emitting thyristor 22 shown in FIG. 12.

The light-emitting thyristor 31 includes the N-type first semiconductor layer 2240, a P-type second semiconductor layer 2230a, the N-type third semiconductor layer 2220, and the P-type fourth semiconductor layer 2210. The first semiconductor layer 2240 includes the cathode layer 2243, the hole barrier layer 2242 and the active layer 2241. The second semiconductor layer 2230a includes the electron barrier layer 2232a as a first layer and the P-type gate layer 2231. The third semiconductor layer 2220 is an N-type gate layer. The fourth semiconductor layer 2210 is an anode layer.

In the second modification of the second embodiment, the impurity concentration of the electron barrier layer 2232 and the impurity concentration of the P-type gate layer 2231 were set at the same value. In contrast, in the light-emitting thyristor 31 according to the first modification of the third embodiment, the impurity concentration IMpg2 of the electron barrier layer 2232a is set higher than the impurity concentration IMpg1 of the P-type gate layer 2231.

The reason for providing the P-type electron barrier layer 2232a having a high Al composition ratio CRe and a wide band gap BGe between the N-type active layer 2241 and the P-type gate layer 2231 is that the P-type electron barrier layer 2232a works as a barrier layer against electrons in the N-type active layer 2241 advancing towards the electron barrier layer 2232a, the electron confinement effect in the N-type active layer 2241 can be enhanced, and the recombination in the active layer 2241 can be increased.

Further, in the first modification of the third embodiment, the impurity concentration IMpg2 of the electron barrier layer 2232a is set higher than the impurity concentration IMpg1 of the P-type gate layer 2231, by which the energy barrier at the junction interface against electrons in the conduction band can be made higher and the electron confinement effect can be enhanced further.

The fourth to first semiconductor layers 2210, 2220, 2230a and 2240 of the light-emitting thyristor 31 shown in FIG. 16 are formed with semiconductor materials similar to those of the first to fourth semiconductor layers 2210, 2220, 2230 and 2240 of the light-emitting thyristor 22 shown in FIG. 11 and FIG. 12. Accordingly, in the light-emitting thyristor 31 shown in FIG. 16, the light emission amount increases due to the rise in the luminous efficiency similarly to the case of the light-emitting thyristor 22 shown in FIG. 11 and FIG. 12.

Furthermore, the active layer 2241 is formed in an upper part (i.e., on a side farther from the substrate part 101) of the light-emitting thyristor 22 as a semiconductor multilayer structure and light generated in the active layer 2241 is extracted in the upward direction, by which the absorption of the light generated in the active layer 2241 is reduced and the light extraction efficiency is increased.

(3-3) Second Modification of Third Embodiment

Figure 17:
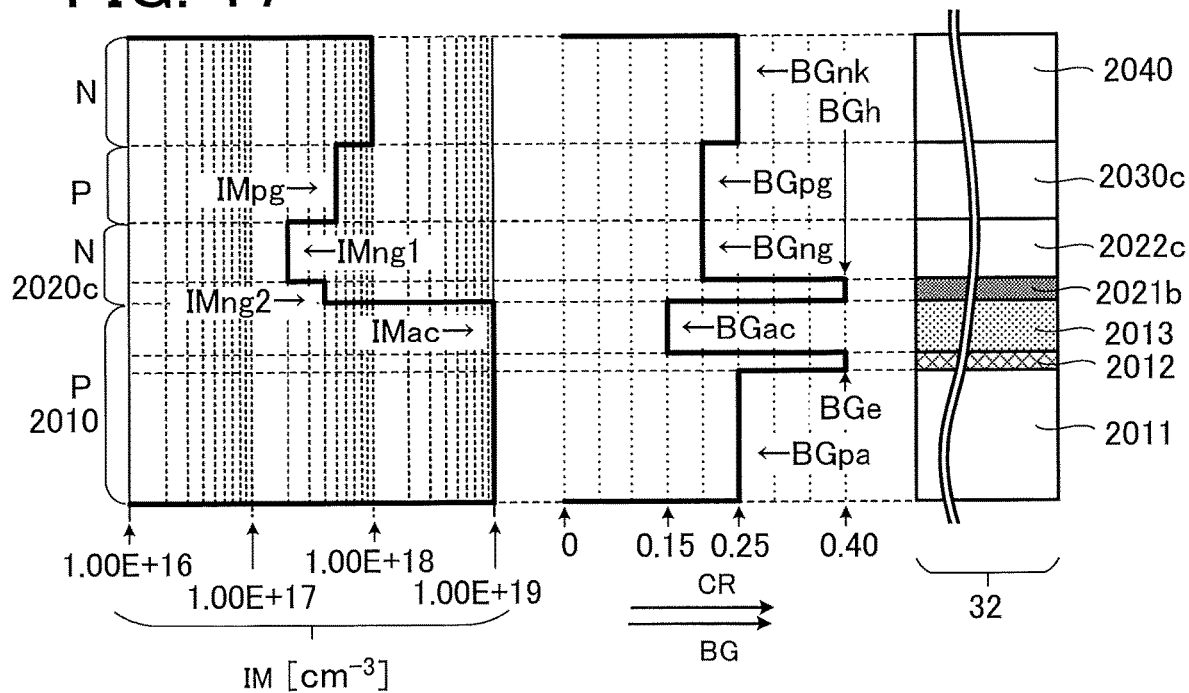
FIG. 17 is a diagram showing an example of the impurity concentration and the Al composition ratio of each semiconductor layer in a light-emitting thyristor according to a second modification of the third embodiment.

FIG. 17 is a diagram showing an example of the impurity concentration IM (cm⁻³) and the Al composition ratio CR of each semiconductor layer in a light-emitting thyristor 32 according to a second modification of the third embodiment. The light-emitting thyristor 32 according to the second modification of the third embodiment differs from the light-emitting thyristor 30 shown in FIG. 14 in that the Al composition ratios CRng and CRpg of an N-type gate layer 2022c of a second semiconductor layer 2020c and a third semiconductor layer (P-type gate layer) 2030c are higher than the Al composition ratio CRac of the active layer 2013. Except for this feature, the light-emitting thyristor 32 according to the second modification of the third embodiment is the same as the light-emitting thyristor 30 shown in FIG. 14.

The first to fourth semiconductor layers 2010, 2020c, 2030c and 2040 of the light-emitting thyristor 32 shown in FIG. 17 are formed with semiconductor materials similar to those of the first to fourth semiconductor layers 2010, 2020b, 2030 and 2040 of the light-emitting thyristor 30 shown in FIG. 14. Accordingly, in the light-emitting thyristor 32 shown in FIG. 17, the light emission amount increases due to the rise in the luminous efficiency similarly to the case of the light-emitting thyristor 30 shown in FIG. 14.

Further, since the Al composition ratios CRng and BGpg in the N-type gate layer 2022c and the third semiconductor layer (P-type gate layer) 2030c are set higher than the Al composition ratio CRac in the active layer 2013 in the light-emitting thyristor 32 shown in FIG. 17, the N-type gate layer 2022c and the third semiconductor layer (P-type gate layer) 2030c have high optical transmittance. Accordingly, light emitted from the active layer 2013 can be radiated upward in FIG. 17 with high efficiency.

(4) Fourth Embodiment (4-1) Configuration and Effect

Figure 18:
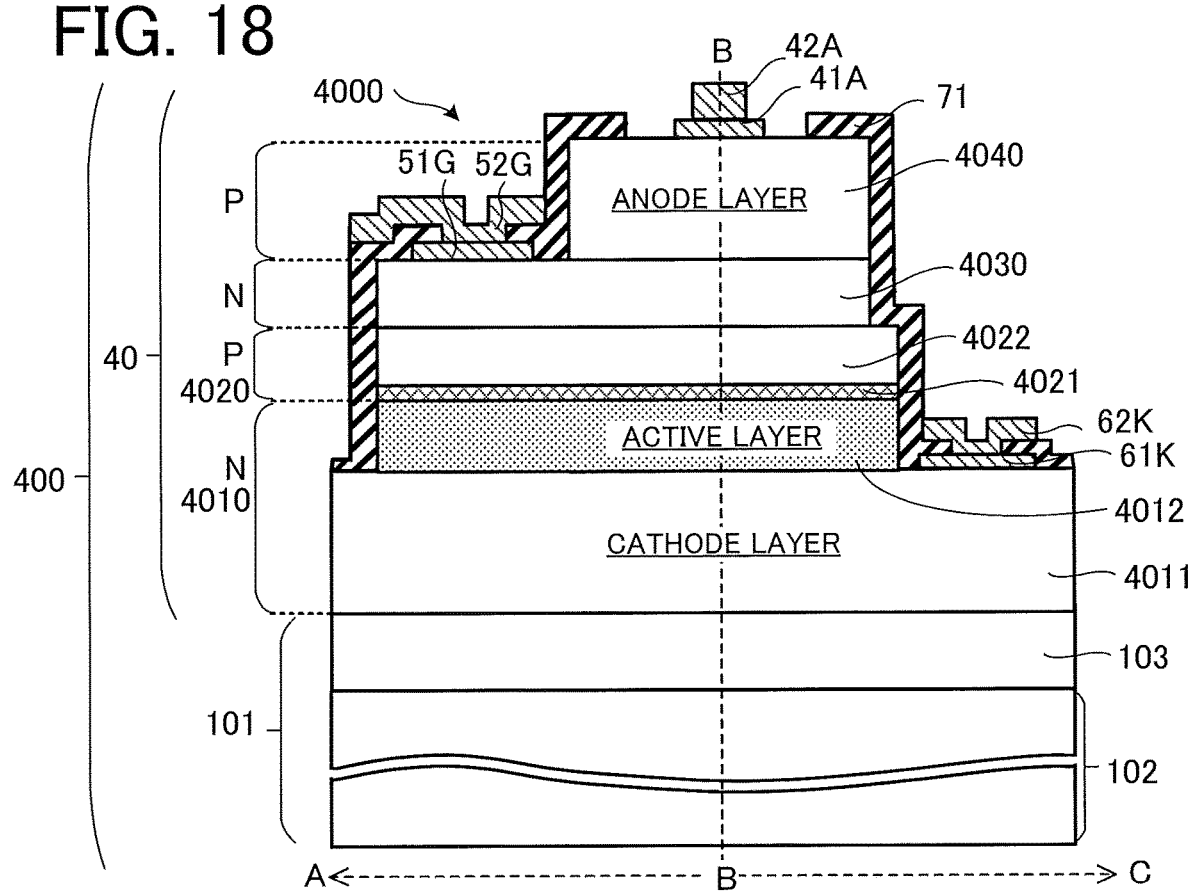
FIG. 18 is a schematic cross-sectional view showing the structure of a light-emitting thyristor according to a fourth embodiment of the present invention.

FIG. 18 is a schematic cross-sectional view showing the structure of a light-emitting thyristor 40 according to a fourth embodiment (namely, the structure of a cross-section taken along the line A-B-C in FIG. 1). A semiconductor device 4000 includes a plurality of light-emitting thyristors 40. A light-emitting element chip 400 includes the substrate part 101 and the semiconductor device 4000.

The light-emitting thyristor 40 in FIG. 18 includes an N-type first semiconductor layer 4010, a P-type second semiconductor layer 4020 arranged adjacent to the first semiconductor layer 4010, an N-type third semiconductor layer (N-type gate layer) 4030 arranged adjacent to the second semiconductor layer 4020, and a P-type fourth semiconductor layer (anode layer) 4040 arranged adjacent to the third semiconductor layer (N-type gate layer) 4030. The first semiconductor layer 4010 includes a cathode layer 4011 arranged on the substrate part 101 and an N-type active layer 4012 arranged adjacent to the cathode layer 4011. The second semiconductor layer 4020 includes a P-type electron barrier layer 4021 arranged adjacent to the active layer 4012 and a P-type gate layer 4022 arranged adjacent to the electron barrier layer 4021. The light-emitting thyristor 40 in FIG. 18 corresponds to a structure obtained by vertically inverting the multilayer structure of the first to fourth semiconductor layers 1240, 1230, 1220 and 1210 of the light-emitting thyristor 12 shown in FIG. 5 (the second modification of the first embodiment) and arranging the inverted multilayer structure on the substrate part 101.

Figure 19:
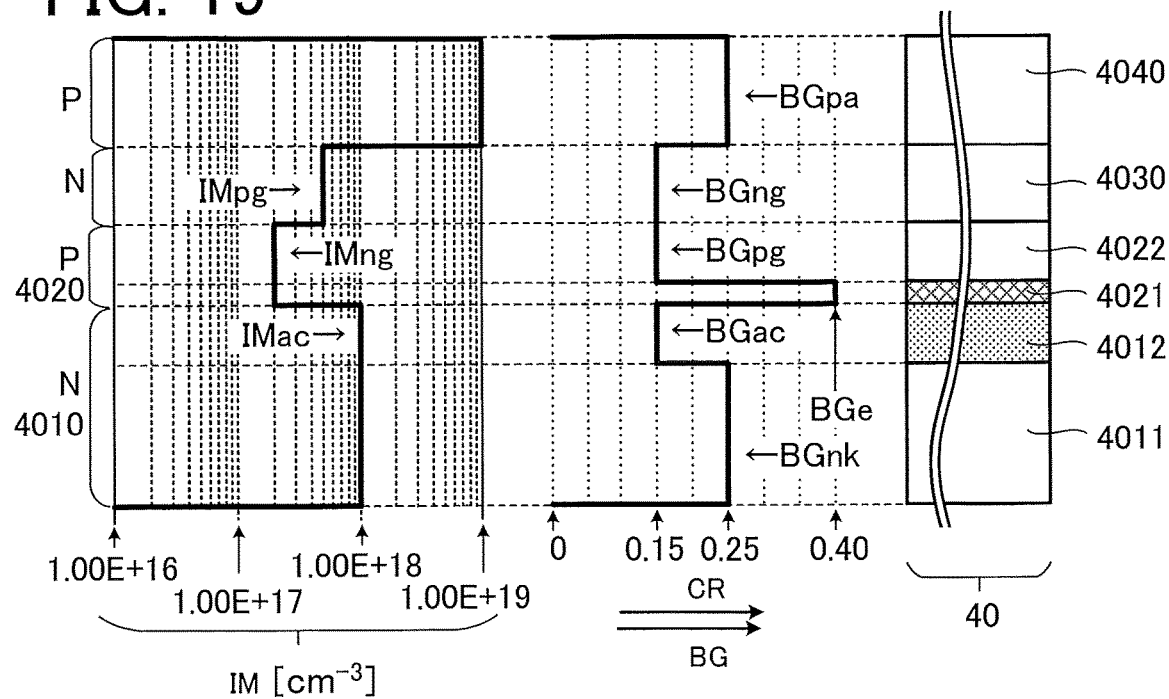
FIG. 19 is a diagram showing an example of the impurity concentration and the Al composition ratio of each semiconductor layer in the light-emitting thyristor in FIG. 18.

FIG. 19 is a diagram showing an example of the impurity concentration IM (cm$^{-3}$) and the Al composition ratio CR of each semiconductor layer in the light-emitting thyristor 40 in FIG. 18. The light-emitting thyristor 40 has structure satisfying the aforementioned conditional expressions (1), (2) and (3a) to (8a) similarly to the second modification of the first embodiment. Accordingly, the P-type electron barrier layer 4021 with a wide band gap BGe works as a barrier layer against electrons in the N-type active layer 4012 advancing towards the electron barrier layer 4021, the electron confinement effect in the N-type active layer 4012 can be enhanced, and the recombination in the active layer 4012 can be increased. Consequently, the light emission amount of the light-emitting thyristor 40 increases.

(4-2) First Modification of Fourth Embodiment

Figure 20:
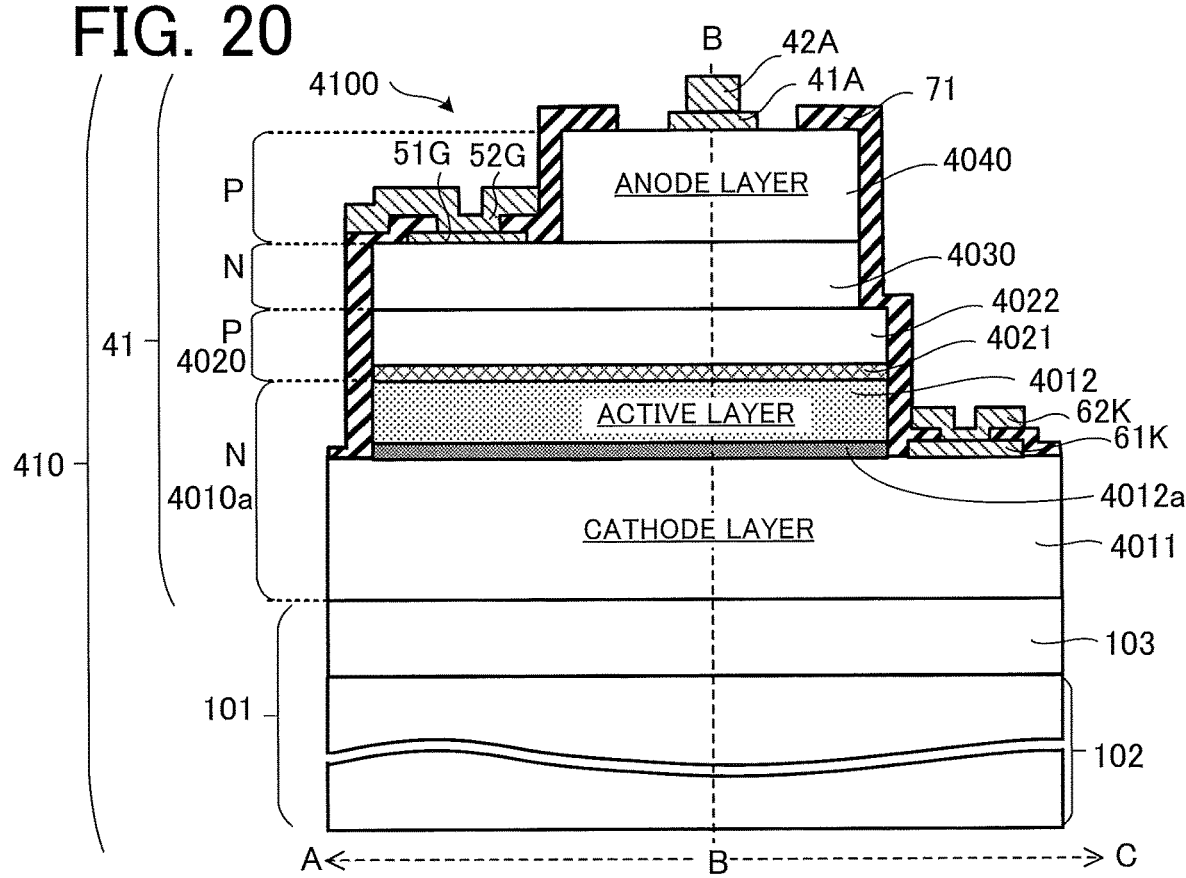
FIG. 20 is a schematic cross-sectional view showing the structure of a light-emitting thyristor according to a first modification of the fourth embodiment.

FIG. 20 is a schematic cross-sectional view showing the structure of a light-emitting thyristor 41 according to a first modification of the fourth embodiment (namely, the structure of a cross-section taken along the line A-B-C in FIG. 1). A semiconductor device 4100 includes a plurality of light-emitting thyristors 41. A light-emitting element chip 410 includes the substrate part 101 and the semiconductor device 4100.

The light-emitting thyristor 41 shown in FIG. 20 includes an N-type first semiconductor layer 4010a, the P-type second semiconductor layer 4020 arranged adjacent to the first semiconductor layer 4010a, the N-type third semiconductor layer (N-type gate layer) 4030 arranged adjacent to the second semiconductor layer 4020, and the P-type fourth semiconductor layer (anode layer) 4040 arranged adjacent to the third semiconductor layer (N-type gate layer) 4030. The first semiconductor layer 4010a includes the cathode layer 4011 arranged on the substrate part 101, an N-type hole barrier layer 4012a arranged adjacent to the cathode layer 4011, and the N-type active layer 4012 arranged adjacent to the hole barrier layer 4012a. The second semiconductor layer 4020 includes the P-type electron barrier layer 4021 arranged adjacent to the active layer 4012 and the P-type gate layer 4022 arranged adjacent to the electron barrier layer 4021. The light-emitting thyristor 41 in FIG. 20 corresponds to a structure obtained by vertically inverting the multilayer structure of the first to fourth semiconductor layers 2240, 2230, 2220 and 2210 of the light-emitting thyristor 22 shown in FIG. 11 (the second modification of the second embodiment) and arranging the inverted multilayer structure on the substrate part 101.

Figure 21:
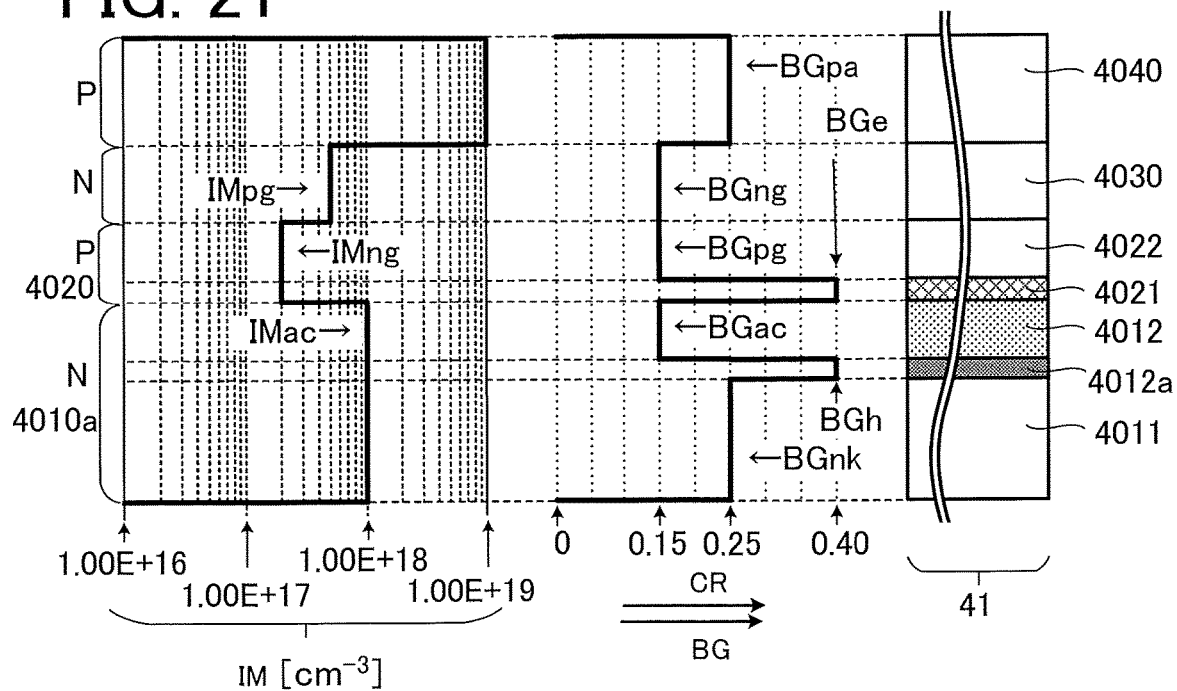
FIG. 21 is a diagram showing an example of the impurity concentration and the Al composition ratio of each semiconductor layer in the light-emitting thyristor in FIG. 20.

FIG. 21 is a diagram showing an example of the impurity concentration IM (cm$^{-3}$) and the Al composition ratio CR of each semiconductor layer in the light-emitting thyristor 41 in FIG. 20. The light-emitting thyristor 41 has structure satisfying the aforementioned conditional expressions (1), (2) and (3d) to (8d) similarly to the second modification of the second embodiment. Accordingly, the P-type electron barrier layer 4021 with a wide band gap BGe works as a barrier layer against electrons in the N-type active layer 4012 advancing towards the electron barrier layer 4021, the electron confinement effect in the N-type active layer 4012 can be enhanced, and the recombination in the active layer 4012 can be increased. Consequently, the light emission amount of the light-emitting thyristor 41 increases.

Further, in a case where the band gap BGh of the hole barrier layer 4012a is wider than the band gap BGnk of the cathode layer 4011 as shown in FIG. 21, the mobility of holes in the active layer 4012 moving towards the cathode layer 4011 is reduced by the hole barrier layer 4012a. Namely, since the hole barrier layer 4012a with the wide band gap has the function as a barrier layer limiting the passage of holes, it is possible to inhibit holes from leaking out from the active layer 4012 to the cathode layer 4011. Accordingly, the decrease in the amount of holes in the active layer 4012 is inhibited and the occurrence probability of the recombination of a hole and an electron in the active layer 4012 becomes high. Consequently, the recombination increases and the light emission amount of the light-emitting thyristor 41 increases.

(5) Fifth Embodiment

Figure 22:
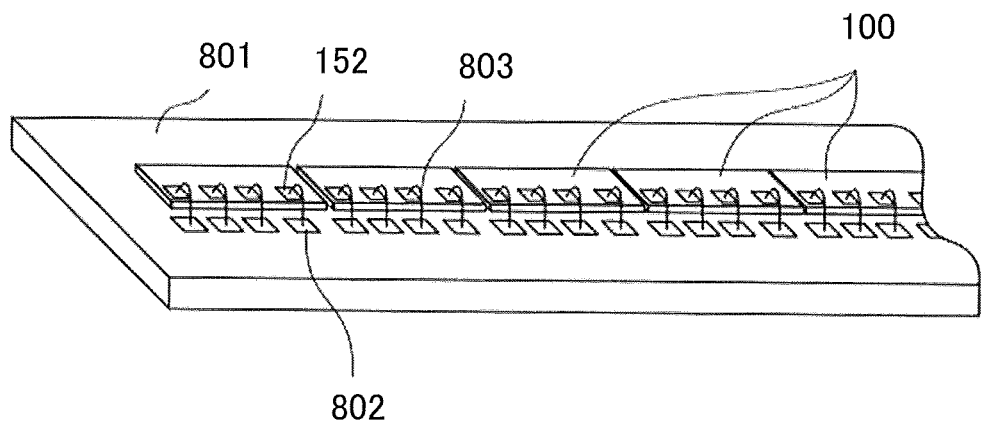
FIG. 22 is a schematic perspective view showing the structure of a substrate unit as a principal part of an optical print head according to a fifth embodiment of the present invention.

FIG. 22 is a schematic perspective view showing the structure of a principal part of an optical print head according to a fifth embodiment. As shown in FIG. 22, a substrate unit as the principal part includes a printed wiring board 801 as a mounting substrate and a plurality of light-emitting element chips 100 arranged like an array. The light-emitting element chips 100 are fixed on the printed wiring board 801 by using a thermosetting resin or the like. Electrode pads 152 of the light-emitting element chips 100 for external connection and connection pads 802 of the printed wiring board 801 are electrically connected to each other by bonding wires 803. The printed wiring board 801 may be equipped with various types of wiring patterns, electronic components, connectors, etc. It is also possible to employ one of other light-emitting element chips described in the first to fourth embodiments instead of the light-emitting element chip 100.

Figure 23:
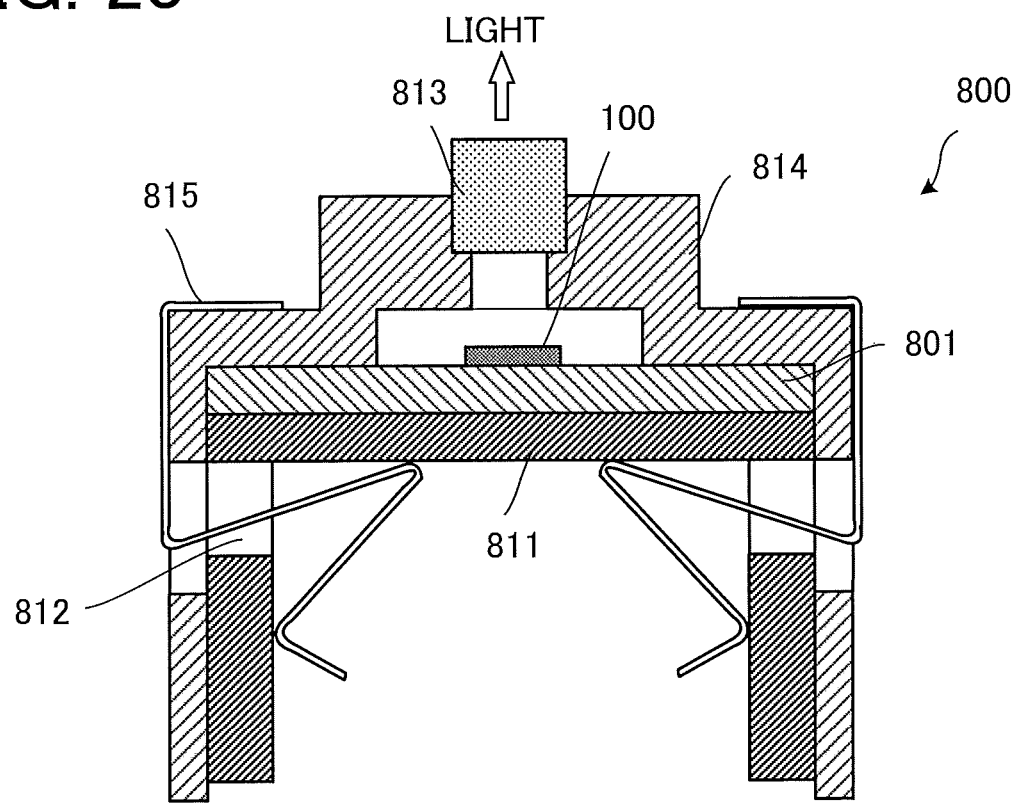
FIG. 23 is a schematic cross-sectional view showing the structure of the optical print head according to the fifth embodiment.

FIG. 23 is a schematic cross-sectional view showing the structure of the optical print head 800 according to the fifth embodiment. The optical print head 800 is an exposure device of an electrophotographic printer as an image forming apparatus of the electrophotographic type. As shown in FIG. 23, the optical print head 800 includes a base member 811, the printed wiring board 801, the light-emitting element chips 100, a lens array 813 including a plurality of upright isometric imaging lenses, a lens holder 814, and clampers 815 as spring members. The base member 811 is a member for fixing the printed wiring board 801. Side faces of the base member 811 are provided with opening parts 812 to be used for fixing the printed wiring board 801 and the lens holder 814 to the base member 811 by use of the clampers 815. The lens holder 814 is formed by injection molding of organic polymeric material, for example. The lens array 813 is a set of optical lenses focusing light emitted from the light-emitting element chips 100 on a photosensitive drum as an image carrier. The lens holder 814 holds the lens array 813 at a prescribed position with respect to the base member 811. The clampers 815 clamp and hold components via the opening parts 812 of the base member 811 and opening parts of the lens holder 814.

In the optical print head 800, the light-emitting thyristors of the light-emitting element chips 100 selectively emit light according to print data, and the light emitted from the light-emitting thyristors is focused on the uniformly charged photosensitive drum by the lens array 813. By this process, an electrostatic latent image is formed on the photosensitive drum, and thereafter, an image made of a developing agent is formed (printed) on a print medium (sheet) by a development process, a transfer process and a fixation process.

As described above, the optical print head 800 according to the fifth embodiment includes the light-emitting element chips 100 of low variations in light emission intensity, and thus print quality can be improved by installing the optical print head 800 in an image forming apparatus.

(6) Sixth Embodiment

Figure 24:
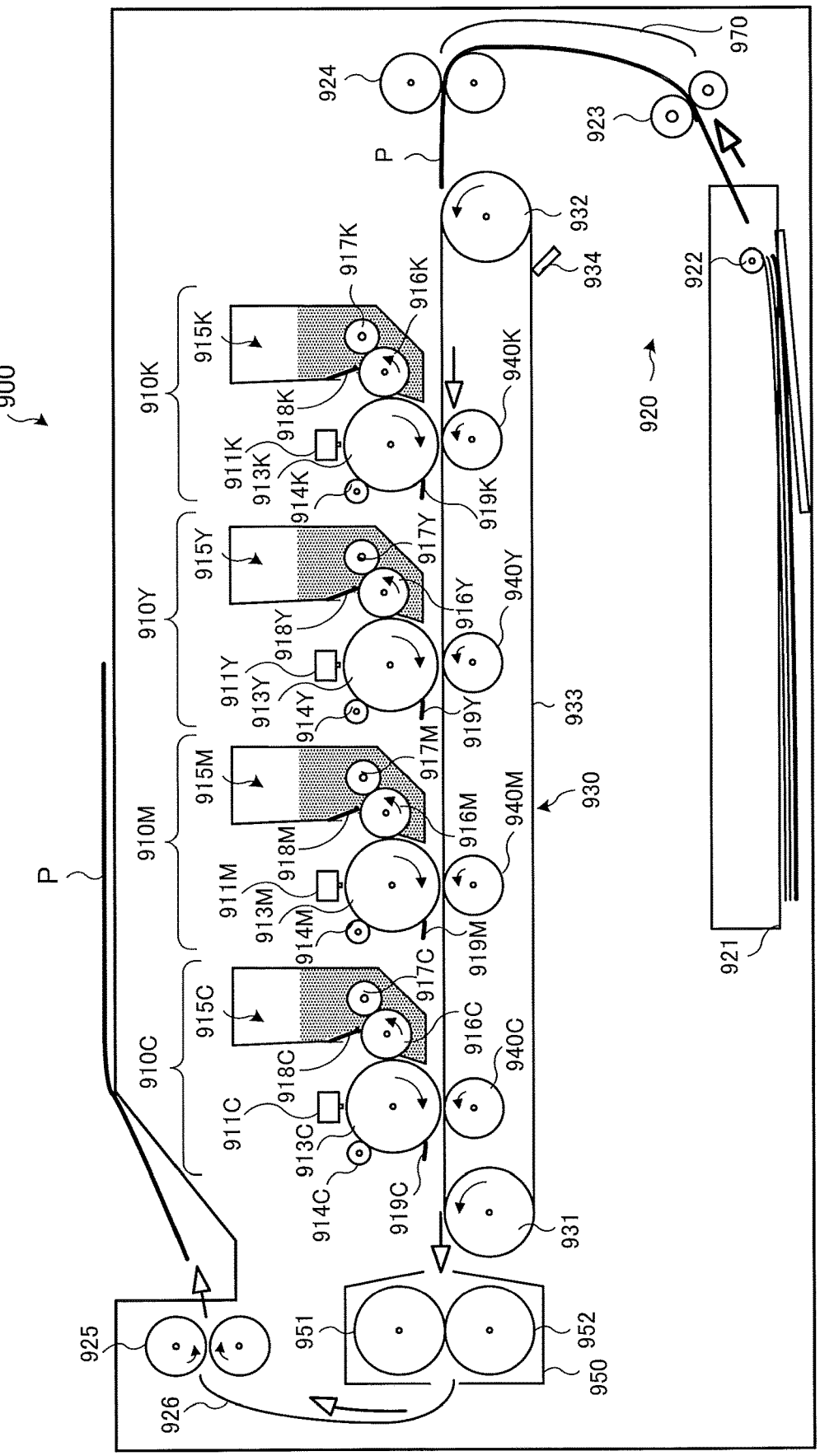
FIG. 24 is a schematic cross-sectional view showing the structure of an image forming apparatus according to a sixth embodiment of the present invention.

FIG. 24 is a schematic cross-sectional view showing the structure of an image forming apparatus 900 according to a sixth embodiment. The image forming apparatus 900 is a color printer using an electrophotographic process, for example.

As shown in FIG. 24, principal components of the image forming apparatus 900 include image formation sections 910K, 910Y, 910M and 910C for forming toner images (i.e. developing agent images) on a record medium P such as a sheet of paper by an electrophotographic process, a medium supply section 920 for supplying the record medium P to the image formation sections 910K, 910Y, 910M and 910C, and a conveyance section 930 for conveying the record medium P. Further, the image forming apparatus 900 includes transfer rollers 940K, 940Y, 940M and 940C as transfer sections arranged respectively corresponding to the image formation sections 910K, 910Y, 910M and 910C, a fixation device 950 for fixing the toner images transferred onto the record medium P, and a guide 926 and an ejection roller pair 925 as a medium ejection section for ejecting the record medium P after passing through the fixation device 950 to the outside of a housing of the image forming apparatus 900. The number of image formation sections included in the image forming apparatus 900 may also be three or less or five or more. Further, the image forming apparatus 900 can also be a monochrome printer, in which the number of image formation sections is one, as long as the image forming apparatus 900 is a device forming an image on a record medium P by means of the electrophotographic process.

As shown in FIG. 24, the medium supply section 920 includes a medium cassette 921, a hopping roller 922 for drawing out the record media P loaded in the medium cassette 921 sheet by sheet, a roller pair 923 for conveying the record medium P drawn out of the medium cassette 921, a guide 970 for guiding the record medium P, and a registration roller•pinch roller 924 for correcting skew of the record medium P.

The image formation sections 910K, 910Y, 910M and 910C respectively form a black (K) toner image, a yellow (Y) toner image, a magenta (M) toner image and a cyan (C) toner image on the record medium P. The image formation sections 910K, 910Y, 910M and 910C are arranged side by side along a medium conveyance path from an upstream side to a downstream side (i.e., from right to left in FIG. 24) in a medium conveyance direction. Each of the image formation sections 910K, 910Y, 910M and 910C may also be configured as a detachable unit. The image formation sections 910K, 910Y, 910M and 910C have basically the same structure as each other except for the difference in the color of the stored toner.

The image formation sections 910K, 910Y, 910M and 910C respectively include optical print heads 911K, 911Y, 911M and 911C as exposure devices for their respective colors. Each of the optical print heads 911K, 911Y, 911M and 911C is the optical print head 800 according to the fifth embodiment.

Each image formation section 910K, 910Y, 910M, 910C includes a photosensitive drum 913K, 913Y, 913M, 913C as a rotatably supported image carrier and a charging roller 914K, 914Y, 914M, 914C as a charging member for uniformly charging the surface of the photosensitive drum 913K, 913Y, 913M, 913C. Further, each image formation section 910K, 910Y, 910M, 910C includes a development unit 915K, 915Y, 915M, 915C for forming a toner image corresponding to an electrostatic latent image by supplying the toner to the surface of the photosensitive drum 913K, 913Y, 913M, 913C after the electrostatic latent image is formed on the surface of the photosensitive drum 913K, 913Y, 913M, 913C by the exposure by the optical print head 911K, 911Y, 911M, 911C.

Each development unit 915K, 915Y, 915M, 915C includes a toner storage section as a developing agent storage section forming a developing agent storage space for storing the toner and a development roller 916K, 916Y, 916M, 916C as a developing agent carrier for supplying the toner to the surface of the photosensitive drum 913K, 913Y, 913M, 913C. Further, each development unit 915K, 915Y, 915M, 915C includes a supply roller 917K, 917Y, 917M, 917C for supplying the toner stored in the toner storage section to the development roller 916K, 916Y, 916M, 916C and a development blade 918K, 918Y, 918M, 918C as a toner regulation member for regulating the thickness of a toner layer on the surface of the development roller 916K, 916Y, 916M, 916C.

The exposure by the optical print head 911K, 911Y, 911M, 911C is performed on the uniformly charged surface of the photosensitive drum 913K, 913Y, 913M, 913C based on image data for the printing. The optical print head 911K, 911Y, 911M, 911C includes a light-emitting element array in which a plurality of light-emitting thyristors as light-emitting elements are arranged in an axis line direction of the photosensitive drum 913K, 913Y, 913M, 913C.

As shown in FIG. 24, the conveyance section 930 includes a conveyance belt (i.e., transfer belt) 933 electrostatically attracting and conveying the record medium P, a drive roller 931 rotated by a drive section and driving the conveyance belt 933, and a tension roller (i.e., driven roller) 932 forming a pair with the drive roller 931 and applying tension to the conveyance belt 933.

As shown in FIG. 24, the transfer rollers 940K, 940Y, 940M and 940C are arranged to respectively face the photosensitive drums 913K, 913Y, 913M and 913C of the image formation sections 910K, 910Y, 910M and 910C across the conveyance belt 933. The toner images respectively formed on the surfaces of the photosensitive drums 913K, 913Y, 913M and 913C of the image formation sections 910K, 910Y, 910M and 910C are successively transferred by the transfer rollers 940K, 940Y, 940M and 940C to the top surface of the record medium P conveyed along the medium conveyance path in the direction of the arrow. Each image formation section 910K, 910Y, 910M, 910C includes a cleaning device 919K, 919Y, 919M, 919C for removing the toner remaining on the photosensitive drum 913K, 913Y, 913M, 913C after the toner image developed on the photosensitive drum 913K, 913Y, 913M, 913C is transferred to the record medium P.

The fixation device 950 includes a pair of rollers 951 and 952 pressed against each other. The roller 951 is a roller (namely, heat roller) 951 including a built-in heater, while the roller 952 is a pressure roller pressed against the roller 951. The record medium P with the toner images to be fixed passes between the pair of rollers 951 and 952 of the fixation device 950. At the time of passage, the toner images to be fixed are heated and pressed and thereby fixed on the record medium P.

A lower surface part of the conveyance belt 933 is provided with a cleaning mechanism including a cleaning blade 934, a waste toner storage section (not shown), etc.

At the time of printing, a record medium P in the medium cassette 921 is drawn out by the hopping roller 922 and is sent to the roller pair 923. Subsequently, the record medium P is sent from the roller pair 923 to the conveyance belt 933 via the registration roller•pinch roller 924 and is conveyed to the image formation sections 910K, 910Y, 910M and 910C according to the traveling of the conveyance belt 933. In each image formation section 910K, 910Y, 910M, 910C, the surface of the photosensitive drum 913K, 913Y, 913M, 913C is charged by the charging roller 914K, 914Y, 914M, 914C and is exposed by the optical print head 911K, 911Y, 911M, 911C, by which an electrostatic latent image is formed. The toner formed into a thin layer on the development roller 916K, 916Y, 916M, 916C electrostatically adheres to the electrostatic latent image, by which a toner image of each color is formed. The toner images of the respective colors are transferred onto the record medium P by the transfer rollers 940K, 940Y, 940M and 940C, by which a color toner image is formed on the record medium P. After the image transfer, the toner remaining on each photosensitive drum 913K, 913Y, 913M, 913C is removed by the cleaning device 919K, 919Y, 919M, 919C. The record medium P with the color toner image formed thereon is sent to the fixation device 950. In the fixation device 950, the color toner image is fixed on the record medium P, by which a color image is formed. The record medium P with the color image formed thereon is conveyed along the guide 926 and ejected by the ejection roller pair 925 to a stacker.

As described above, the image forming apparatus 900 according to the sixth embodiment employs the optical print head 800 according to the fifth embodiment as each of the optical print heads 911K, 911Y, 911M and 911C, and thus the print quality of the image forming apparatus 900 can be improved.

(7) Modification

It is also possible to employ structures obtained by reversing the conductivity types of the semiconductor layers forming the light-emitting thyristors in the first to fourth embodiments.

EXPLANATION OF REFERENCE CHARACTERS 10-13, 20-23, 30-32, 40, 41: light-emitting thyristor, 41A: anode electrode, 51G: gate electrode, 61K: cathode electrode, 71: insulation film, 100, 110, 120, 200, 210, 220, 400, 410: light-emitting element chip, 101: substrate part, 102: substrate, 103: planarization layer, 800: optical, print head, 801: printed wiring board, 900: image forming apparatus, 1000, 1100, 1200, 2000, 2100, 2200, 4000, 4100: semiconductor device, 1010, 1110, 1240, 2010, 2110, 2240, 4010, 4010a: first semiconductor layer, 1020, 1120, 1230, 1020a, 2020, 2120, 2230, 2020a, 2020b, 2020c, 2230a, 4020: second semiconductor layer, 1030, 1130, 1220, 1030a, 2030, 2130, 2220, 2230a, 2030b, 4030: third semiconductor layer, 1040, 1140, 1210, 2040, 2140, 2210, 4040: fourth semiconductor layer, 1012, 1112, 1241, 2013, 2113, 2241, 2313, 4012: active layer, 1021, 1121, 2021, 2121, 2232, 2321, 2021a, 2021b: positive hole layer (first layer), 1232, 2232, 2232a, 4021: electron barrier layer (first layer), 1022, 1122, 1022a, 2022, 2122, 2322: N-type gate layer (second layer), 1231, 2231, 4022: P-type gate layer (second layer), 2012, 2112: electron barrier layer (third layer), 2242, 4012a: positive barrier layer (third layer), 2011, 2111, 2311: anode layer (fourth layer), 2243, 4011: cathode layer (fourth layer).

What is claimed is:
1. A light-emitting thyristor comprising:
 a first semiconductor layer of a first conductivity type;
 a second semiconductor layer of a second conductivity type arranged adjacent to the first semiconductor layer;

a third semiconductor layer of the first conductivity type arranged adjacent to the second semiconductor layer; and a fourth semiconductor layer of the second conductivity type arranged adjacent to the third semiconductor layer, wherein the first semiconductor layer includes an active layer adjacent to the second semiconductor layer, the second semiconductor layer includes a first layer adjacent to the active layer and a second layer arranged between the first layer and the third semiconductor layer, the first layer has a band gap wider than a band gap of the active layer and a band gap of the second layer, and the band gap of the second layer is equal to or wider than the band gap of the active layer.

2. The light-emitting thyristor according to claim 1, wherein impurity concentration of the first layer is lower than impurity concentration of the active layer and equal to impurity concentration of the second layer.

3. The light-emitting thyristor according to claim 1, wherein impurity concentration of the first layer is lower than impurity concentration of the active layer and higher than impurity concentration of the second layer.

4. The light-emitting thyristor according to claim 1, wherein impurity concentration of the first semiconductor layer is higher than impurity concentration of the second semiconductor layer and impurity concentration of the third semiconductor layer.

5. The light-emitting thyristor according to claim 1, wherein impurity concentration of the fourth semiconductor layer is higher than impurity concentration of the second semiconductor layer and impurity concentration of the third semiconductor layer.

6. The light-emitting thyristor according to claim 1, wherein
the active layer is an AlGaAs layer whose Al composition ratio is higher than or equal to 0.14 and lower than or equal to 0.18, the second layer is an AlGaAs layer whose Al composition ratio is higher than or equal to 0.14 and lower than or equal to 0.25, the third semiconductor layer is an AlGaAs layer whose Al composition ratio is higher than or equal to 0.14 and lower than or equal to 0.25, and the first layer is an AlGaAs layer whose Al composition ratio is higher than or equal to 0.2 and lower than or equal to 0.5.

7. The light-emitting thyristor according to claim 1, wherein the first semiconductor layer includes:
a third layer adjacent to the active layer on a side opposite to the first layer; and
a fourth layer adjacent to the third layer on a side opposite to the active layer, wherein the third layer has a band gap wider than the band gap of the active layer and the band gap of the fourth layer.

8. The light-emitting thyristor according to claim 7, wherein
the active layer is an AlGaAs layer whose Al composition ratio is higher than or equal to 0.14 and lower than or equal to 0.18, the second layer is an AlGaAs layer whose Al composition ratio is higher than or equal to 0.14 and lower than or equal to 0.25, the third semiconductor layer is an AlGaAs layer whose Al composition ratio is higher than or equal to 0.14 and lower than or equal to 0.25, the first layer is an AlGaAs layer whose Al composition ratio is higher than or equal to 0.2 and lower than or equal to 0.5, and the third layer is an AlGaAs layer whose Al composition ratio is higher than or equal to 0.2 and lower than or equal to 0.5.

9. The light-emitting thyristor according to claim 1, wherein the first conductivity type is a P type and the second conductivity type is an N type.

10. The light-emitting thyristor according to claim 1, wherein the first conductivity type is an N type and the second conductivity type is a P type.

11. The light-emitting thyristor according to claim 1, further comprising:
a first electrode electrically connected to the first semiconductor layer;
a second electrode electrically connected to the second semiconductor layer or the third semiconductor layer; and
a third electrode electrically connected to the fourth semiconductor layer.

12. A light-emitting element chip comprising:
a substrate part; and
the light-emitting thyristor according to claim 1 arranged on the substrate part.

13. The light-emitting element chip according to claim 12, wherein the first semiconductor layer is arranged on a side closer to the substrate part than the fourth semiconductor layer.

14. The light-emitting element chip according to claim 12, wherein the first semiconductor layer is arranged on a side farther from the substrate part than the fourth semiconductor layer.

15. An optical print head comprising the light-emitting element chip according to claim 12.

16. An image forming apparatus comprising the optical print head according to claim 15.

* * * * *